United States Patent
Kumura et al.

(10) Patent No.: US 7,612,398 B2
(45) Date of Patent: Nov. 3, 2009

(54) SEMICONDUCTOR STORAGE DEVICE AND METHOD OF MANUFACTURING THE SAME

(75) Inventors: Yoshinori Kumura, Yokohama (JP); Yoshiro Shimojo, Yokohama (JP); Iwao Kunishima, Yokohama (JP); Tohru Ozaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 10/931,193

(22) Filed: Sep. 1, 2004

(65) Prior Publication Data
US 2006/0002170 A1 Jan. 5, 2006

(30) Foreign Application Priority Data
Jul. 2, 2004 (JP) ............... 2004-196843

(51) Int. Cl.
*H01L 21/02* (2006.01)
(52) U.S. Cl. ............... 257/298; 257/E27.104; 365/145
(58) Field of Classification Search ............... 257/295, 257/296, 306, 49, 298, 325, 326, 297, 310, 257/311, E21.664, E27.104, E21.009; 438/3, 438/244, 240; 365/145
See application file for complete search history.

(56) References Cited

U.S. PATENT DOCUMENTS

| | | | |
|---|---|---|---|
| 5,903,492 A | 5/1999 | Takashima | |
| 6,930,340 B2* | 8/2005 | Hasegawa et al. | 257/295 |
| 7,078,241 B2* | 7/2006 | Son et al. | 438/3 |
| 2002/0096771 A1* | 7/2002 | Yamada et al. | 257/758 |
| 2004/0094791 A1* | 5/2004 | Ito et al. | 257/310 |
| 2004/0185635 A1* | 9/2004 | Tatsunari | 438/396 |

FOREIGN PATENT DOCUMENTS

| | | |
|---|---|---|
| JP | 2002-110932 | 4/2002 |
| JP | 2003-68987 | 3/2003 |
| JP | 2003-273328 | 9/2003 |

* cited by examiner

*Primary Examiner*—Thomas L Dickey
*Assistant Examiner*—Fazli Erdem
(74) *Attorney, Agent, or Firm*—Oblon, Spivak, McClelland, Maier & Neustadt, L.L.P.

(57) ABSTRACT

A semiconductor storage device wherein a plurality of ferroelectric capacitors are sufficiently covered with a hydrogen barrier film formed thereon comprises a field effect transistor formed on one surface side of a semiconductor substrate, a plurality of ferroelectric capacitors formed close to each other above the field effect transistor, an insulting film configured to cover the plurality of ferroelectric capacitors and planarised a space between adjacent ferroelectric capacitors in a self-aligned manner during formation thereof, and a hydrogen barrier film formed on the insulating film.

6 Claims, 30 Drawing Sheets

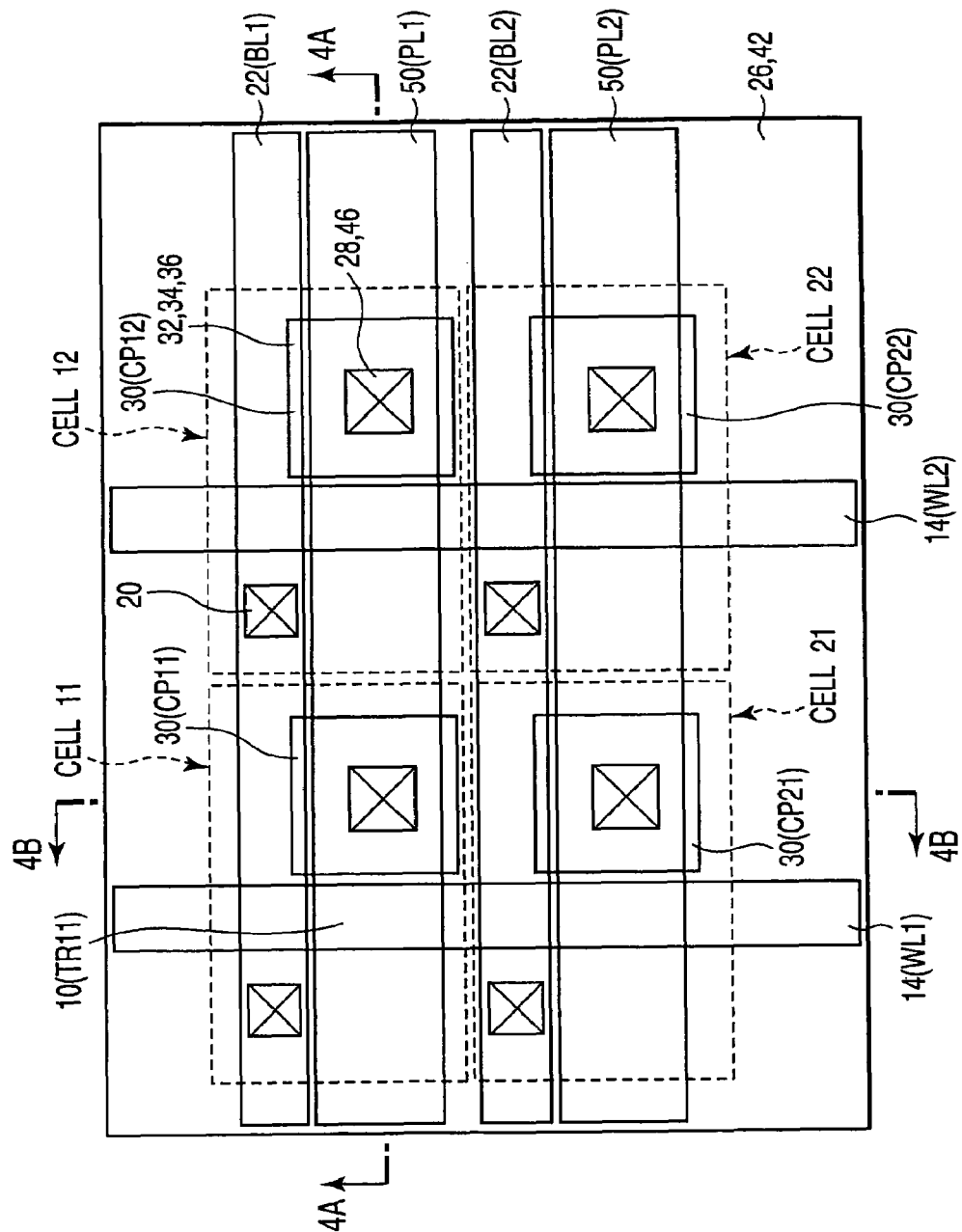
F I G. 3

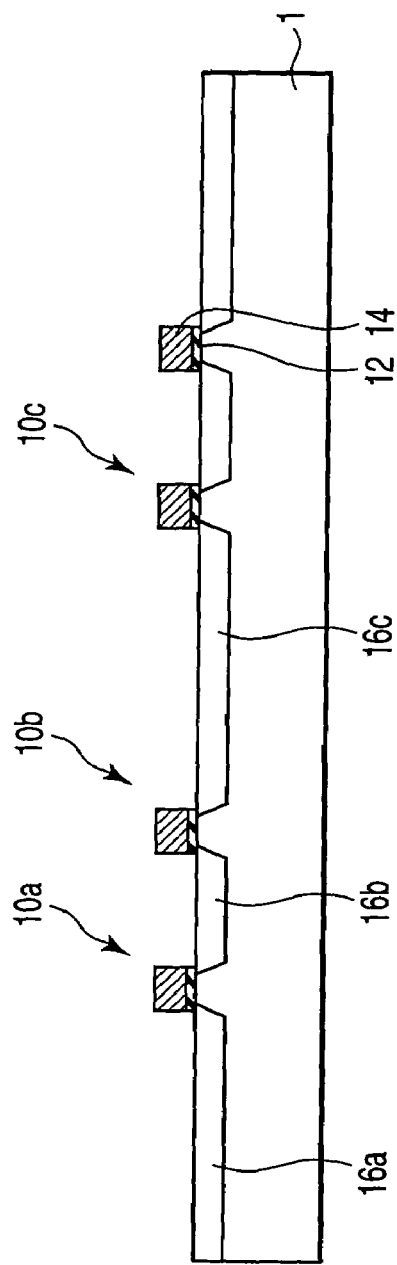
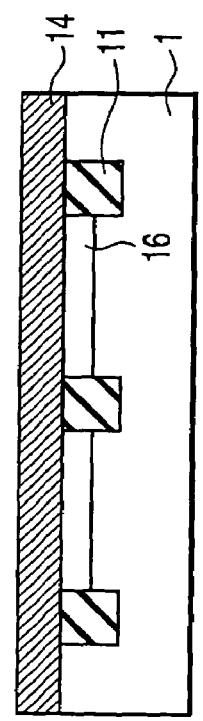

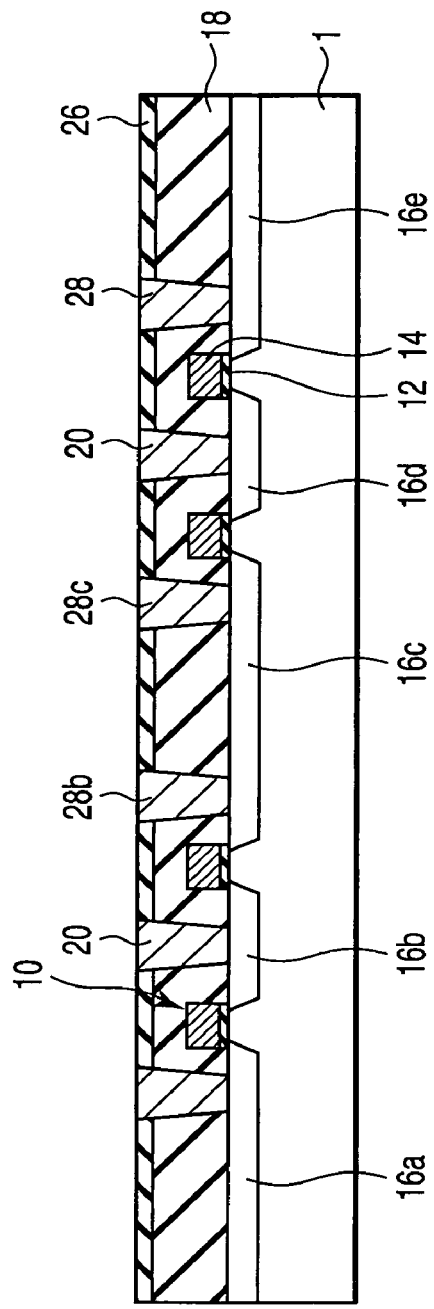
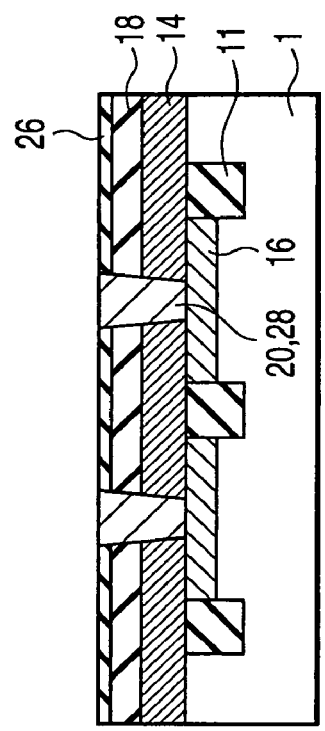
FIG. 20A
FIG. 20B

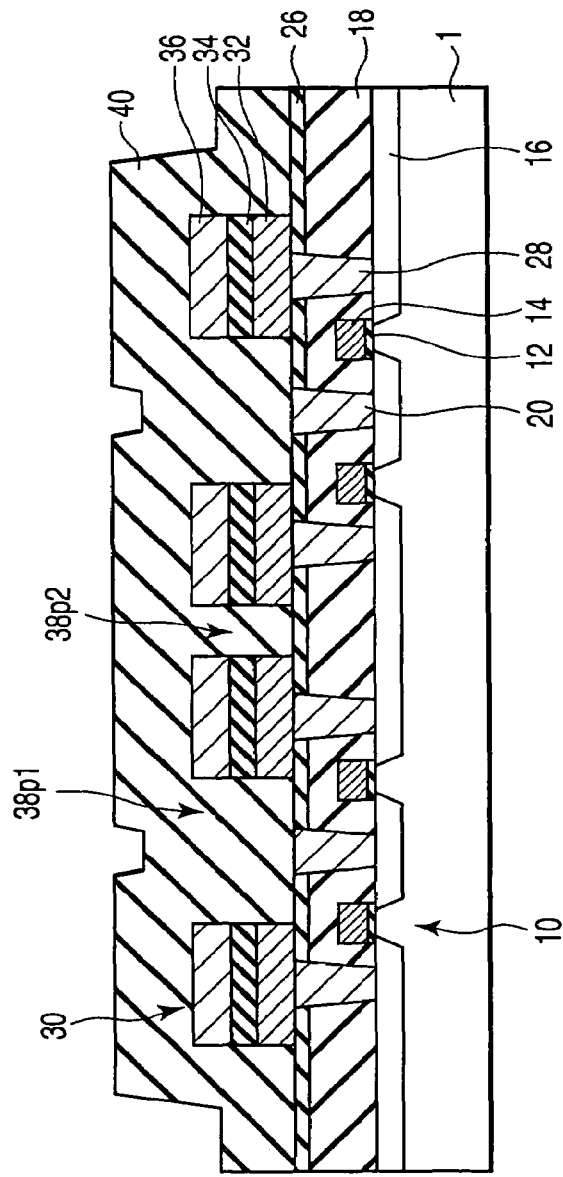
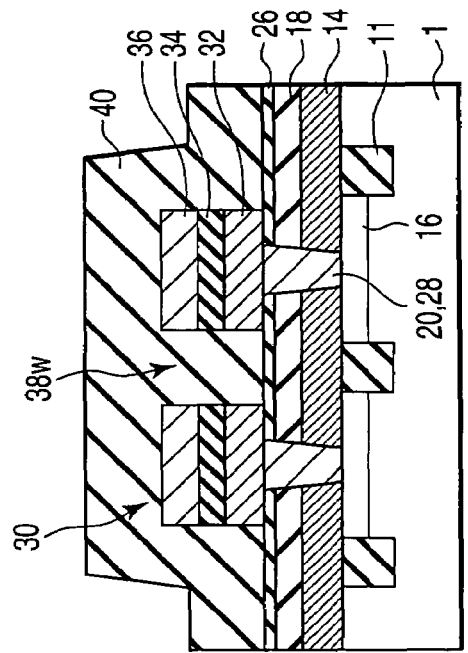
FIG. 22A
FIG. 22B

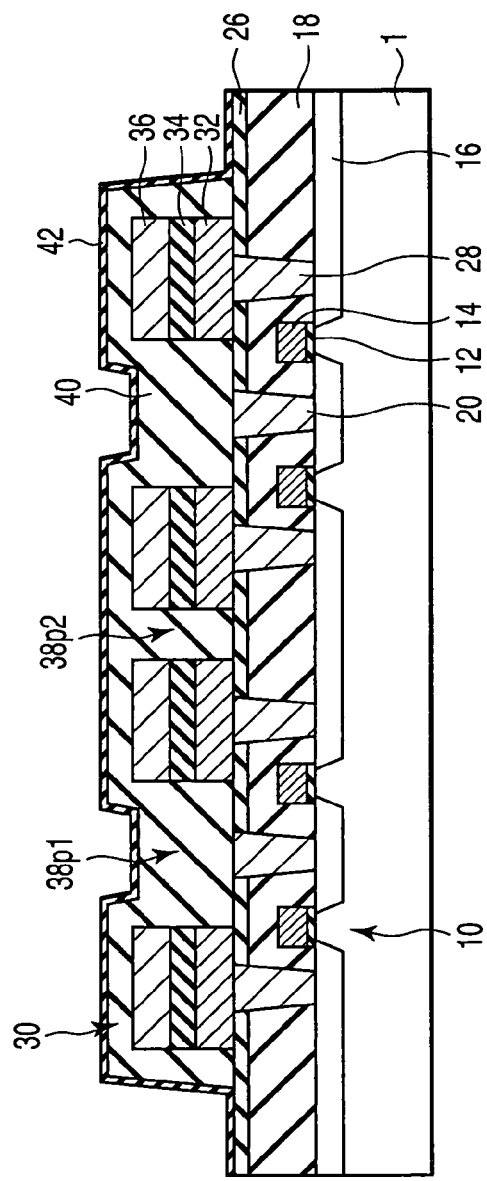
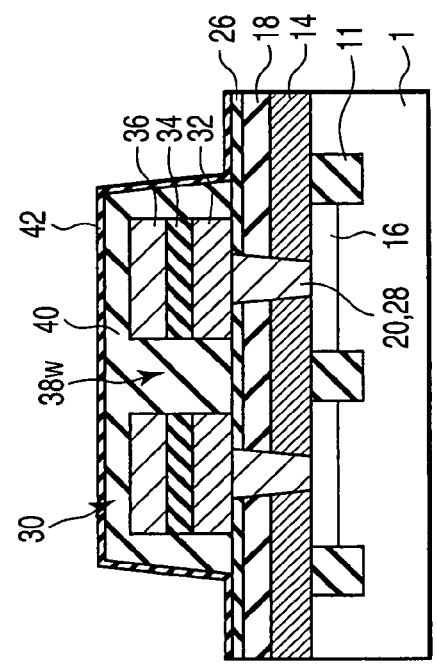
FIG. 24A
FIG. 24B

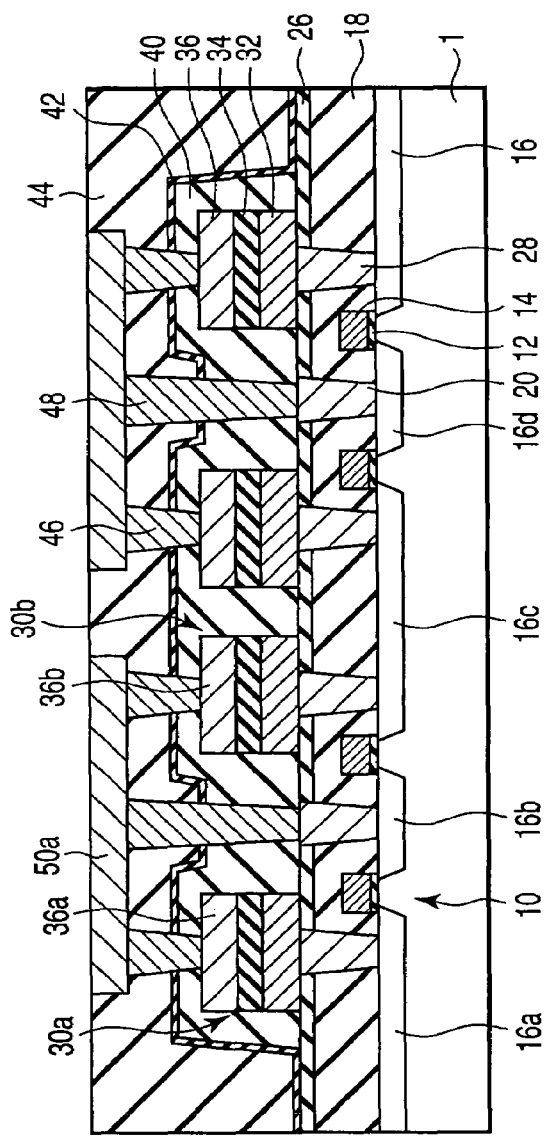
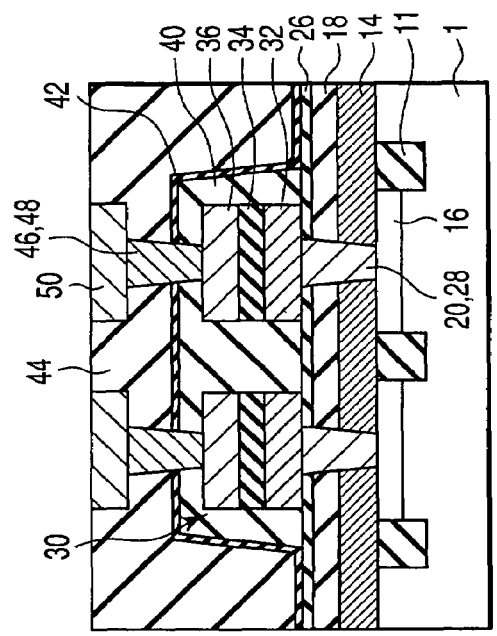
FIG. 25A
FIG. 25B

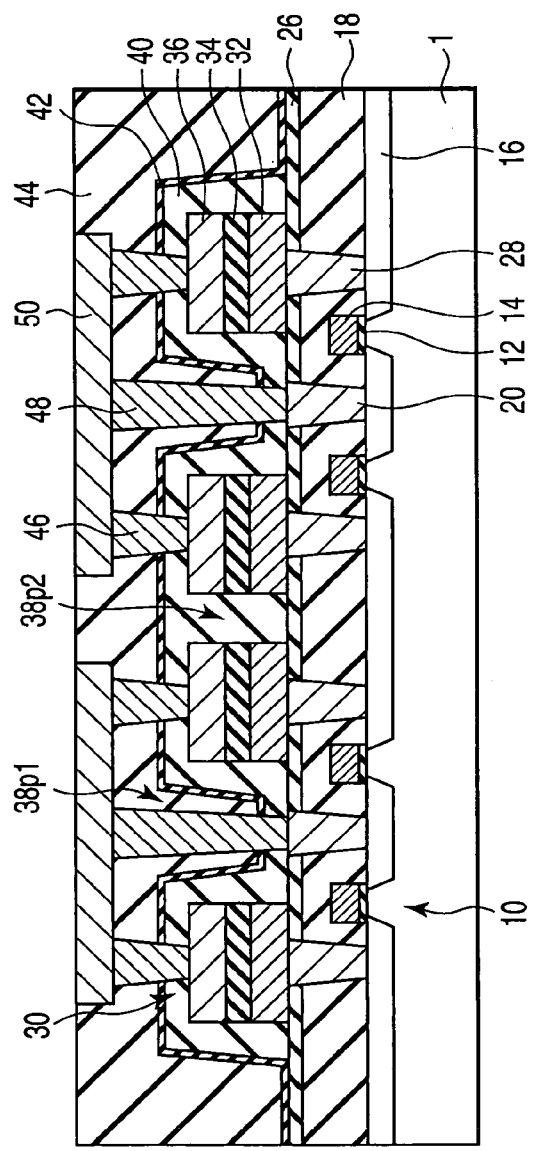
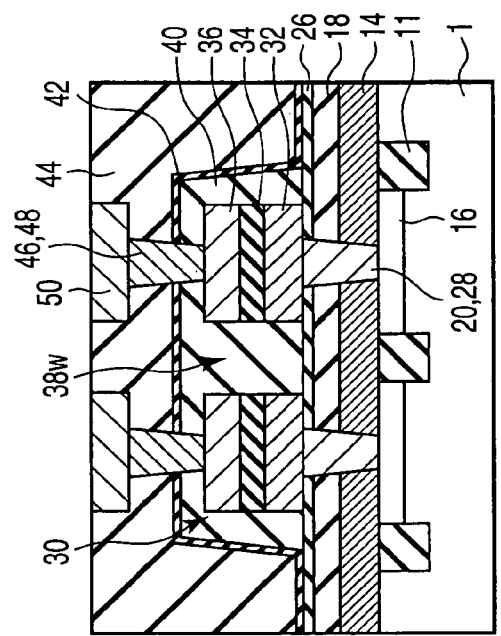
FIG. 27A
FIG. 27B

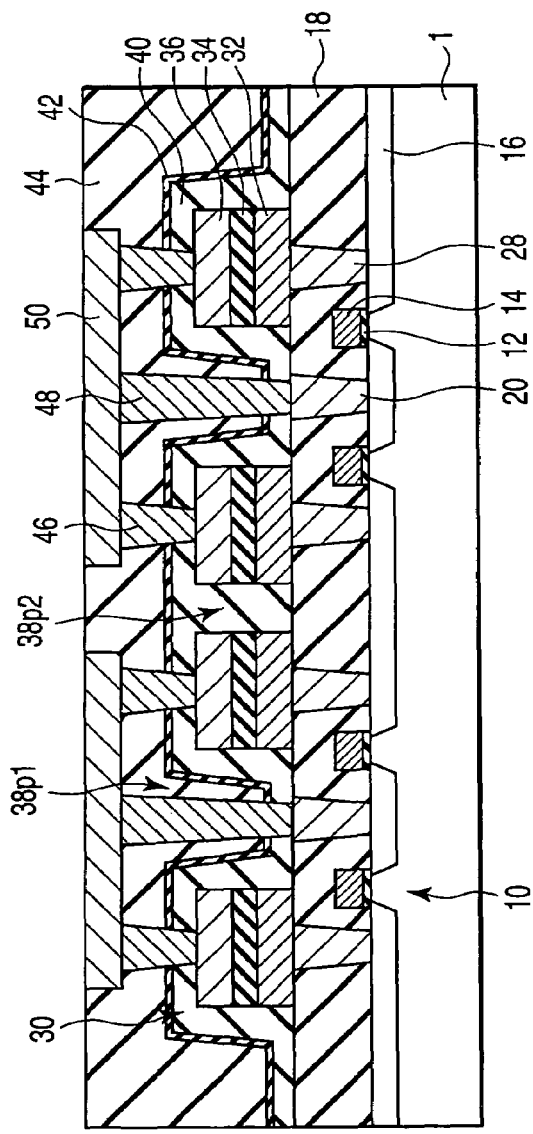
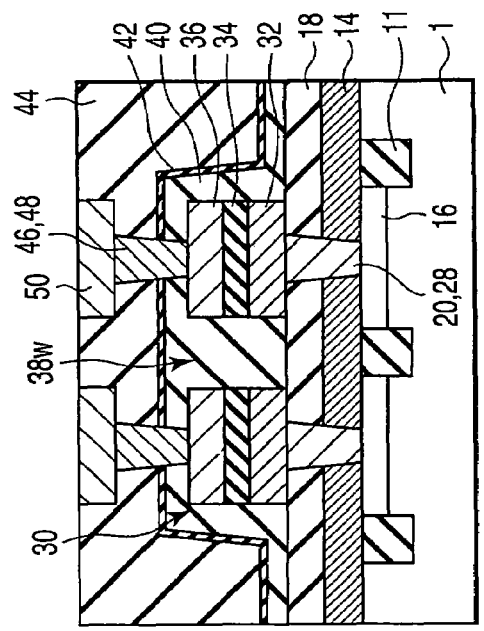
FIG. 28A
FIG. 28B

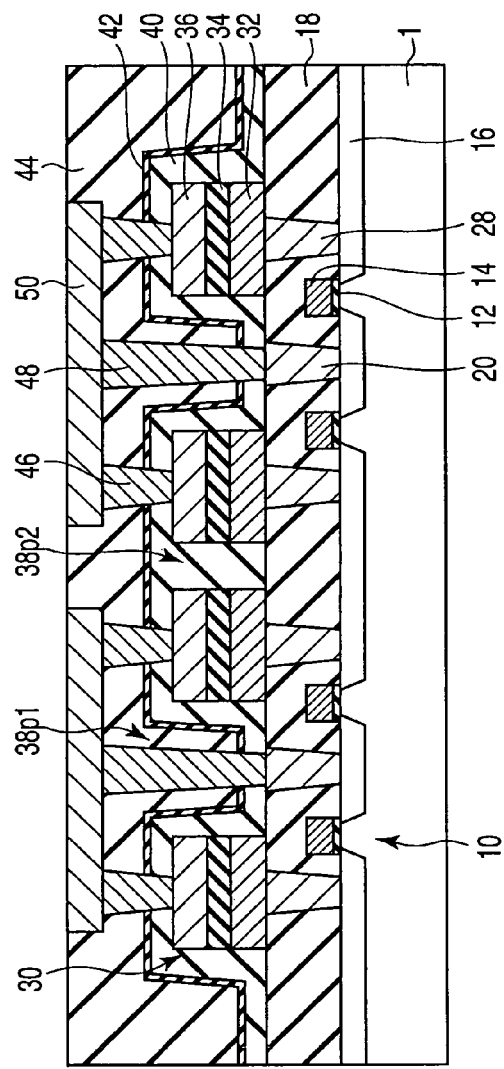
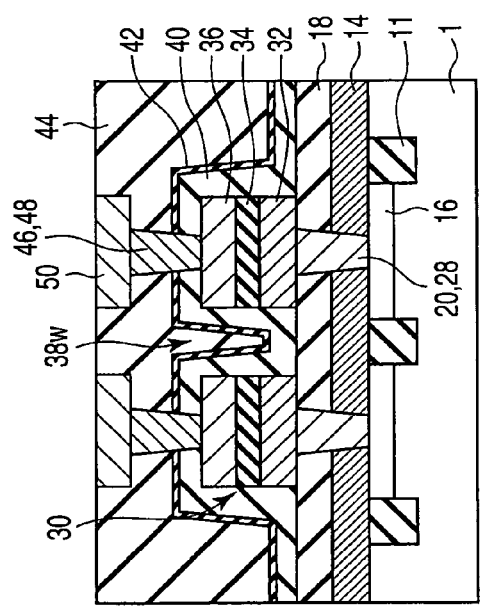
FIG. 30A
FIG. 30B

US 7,612,398 B2

SEMICONDUCTOR STORAGE DEVICE AND METHOD OF MANUFACTURING THE SAME

CROSS-REFERENCE TO RELATED APPLICATIONS

This application is based upon and claims the benefit of priority from prior Japanese Patent Application No. 2004-196843, filed Jul. 2, 2004, the entire contents of which are incorporated herein by reference.

BACKGROUND OF THE INVENTION

1. Field of the Invention

The present invention relates to a semiconductor device and its manufacturing method, and more particularly, to a semiconductor device which uses a ferroelectric film and its manufacturing method.

2. Description of the Related Art

In a semiconductor device in which memory cells are 2-dimensionally arranged, specifically in a semiconductor device comprising memory cells with stacked type structure, miniaturization has been accompanied by a narrower space between the cells, and a ratio (aspect ratio) between a height and a width of the stacked memory cell has been increased. In a semiconductor device such as a ferroelectric random access memory (FeRAM) constituted of a ferroelectric capacitor using a ferroelectric film, when hydrogen penetrates into the capacitor in a manufacturing process after the ferroelectric capacitor is formed, characteristics of the capacitor, especially polarization characteristics of the ferroelectric film, are deteriorated. In order to prevent such deterioration, the capacitor is covered with a hydrogen barrier film, e.g., an aluminum oxide film ($Al_2O_3$ film), to prevent the penetration of hydrogen. As the $Al_2O_3$ film is generally formed by sputtering, at a stepped portion with a higher aspect ratio, coverage of the $Al_2O_3$ film becomes poorer thereof, and the capacitor cannot be sufficiently covered with the $Al_2O_3$ film.

FIG. 31 shows an example of a ferroelectric memory according to a conventional art. This example shows a source/drain 16 of a metal-oxide semiconductor field effect transistor (MOS transistor) 10 formed on a semiconductor substrate 1, a ferroelectric capacitor 30, and a contact plug 28 formed in a first interlevel insulator 18 for interconnecting these components. The ferroelectric capacitor 30 has a structure in which a ferroelectric film 34 as a capacitive insulator is interposed between a lower electrode 32 and an upper electrode 36. A second interlevel insulator 40 is formed on the ferroelectric capacitor 30, and a hydrogen barrier film 42 made of an $Al_2O_3$ film is formed thereon. For example, as a space 38 between ferroelectric capacitors 30a and 30b becomes narrower, an aspect ratio becomes higher, especially an aspect ratio after the formation of the second interlevel insulator 40 becomes higher. When the $Al_2O_3$ film 42 is formed on this structure by sputtering, the $Al_2O_3$ film 42 becomes thin in a bottom part of the space 38, and no film is formed in an extreme case. Consequently, an effect of preventing the penetration of hydrogen may become insufficient. Thus, it is desired that a surface of the second interlevel insulator 40 between the ferroelectric capacitors 30 is planarised, and the $Al_2O_3$ film as the hydrogen barrier film 42 will be formed with an excellent coverage. The planarised surface of the second interlevel insulator 40 can be realized by chemical-mechanical planarization, but it requires an additional process.

FIG. 32 shows an example of switching charge characteristics with respect to the space between the capacitors of the ferroelectric memory according to the conventional art. As apparent from the drawing, switching charge characteristics are deteriorated when the space between the capacitors becomes less than 0.4 µm. This deterioration occurs when the space between the capacitors becomes narrower and coverage of the hydrogen barrier film becomes poorer, and then hydrogen penetrates into the capacitors during the manufacturing process of the semiconductor device after the formation of the ferroelectric capacitors to deteriorate polarization characteristics thereof.

Jpn. Pat. Appln. KOKAI Publication No. 2003-68987 discloses an example of using a hydrogen barrier film to a ferroelectric capacitor. In this example, an upper electrode 10 of the ferroelectric capacitor C has an area smaller than those of a lower electrode 7 or a capacitive insulator 9 (a ferroelectric film). Consequently, a step is formed at an edge of the ferroelectric capacitor C. In order to reduce the step height, an interlayer film 15 is formed to cover the capacitor C, and a hydrogen barrier film 11 is formed thereon. In this example, no consideration is given to a space between capacitors when a plurality of capacitors are formed close to each other, which will cause a problem in a miniaturized semiconductor device.

Additionally, Jpn. Pat. Appln. KOKAI Publication No. 2003-273328 discloses an example of applying an encapsulation barrier film (hydrogen barrier film) 90 to a ferroelectric memory which comprises a plurality of ferroelectric capacitors 60. In this example, a via hole 115 is formed in an interlevel insulator 70 which covers the ferroelectric capacitor 60, and a plate line 120 is formed to interconnect at least two adjacent ferroelectric capacitors 60. During the formation of the via hole 115, the encapsulation barrier film 90 formed between the adjacent ferroelectric capacitors 60 is removed. As a result, the encapsulation barrier film (hydrogen barrier film) 90 does not cover completely all of the plurality of ferroelectric capacitors 60.

Therefore, in the miniaturized ferroelectric capacitor, it is desired to planarise interlevel insulator between ferroelectric capacitors without adding any steps to the process, and to form the hydrogen barrier film thereon with excellent coverage.

The present invention has been made to solve the aforementioned problems, and objects of the invention are to provide a semiconductor storage device wherein a plurality of ferroelectric capacitors are sufficiently covered with a hydrogen barrier film, and a method of manufacturing the same.

BRIEF SUMMARY OF THE INVENTION

According to one aspect of the present investigation, a semiconductor storage device comprises: a field effect transistor formed on one surface side of a semiconductor substrate, a plurality of ferroelectric capacitors formed close to each other above the field effect transistor, an insulting film configured to cover the plurality of ferroelectric capacitors and planarised a space between adjacent ferroelectric capacitors in a self-aligned manner during formation thereof, and a hydrogen barrier film formed on the insulating film.

According to another aspect of the present investigation, a semiconductor storage device comprises: a field effect transistor formed on one surface side of a semiconductor substrate, a first hydrogen barrier film formed above the field effect transistor, a plurality of ferroelectric capacitors formed close to each other above the first hydrogen barrier film, an insulting film configured to cover the plurality of ferroelectric capacitors and planarise a space between adjacent ferroelectric capacitors in a self-aligned manner during formation thereof, and a second hydrogen barrier film formed on the insulating film.

According to still another aspect of the present investigation, a method of manufacturing a semiconductor storage device comprises: forming a field effect transistor on one surface side of a semiconductor substrate, forming a plurality of ferroelectric capacitors close to each other above the field effect transistor, forming an insulting film configured to cover the plurality of ferroelectric capacitors and planarise a space between adjacent ferroelectric capacitors in a self-aligned manner during formation thereof, and forming a hydrogen barrier film on the insulating film.

According to yet another aspect of the present investigation, a method of manufacturing a semiconductor storage device comprises: forming a field effect transistor on one surface side of a semiconductor substrate, forming a first hydrogen barrier film above the field effect transistor, forming a plurality of ferroelectric capacitors close to each other above the first hydrogen barrier film, forming an insulting film configured to cover the plurality of ferroelectric capacitors and planarise a space between adjacent ferroelectric capacitors in a self-aligned manner during formation thereof, and forming a second hydrogen barrier film on the insulating film.

BRIEF DESCRIPTION OF THE SEVERAL VIEWS OF THE DRAWING

FIG. 3 is a plan view showing an example of a semiconductor device according to a first embodiment of the present invention;

FIG. 4A shows a sectional structure in a direction parallel to a plate line (PL) including a section cut along a line 4A-4A in FIG. 3, and FIG. 4B shows a sectional structure in a direction parallel to a word line (WL) including a section cut along a line 4B-4B in FIG. 3;

FIG. 5A shows a sectional structure in a direction parallel to PL indicated by the cut line 4A-4A in FIG. 3, and FIG. 5B shows a sectional structure in a direction parallel to WL indicated by the cut line 4B-4B in FIG. 3;

FIG. 6A shows a sectional structure in a direction parallel to PL, and FIG. 6B shows a sectional structure in a direction parallel to WL;

FIG. 7A shows a sectional structure in a direction parallel to PL, and FIG. 7B shows a sectional structure in a direction parallel to WL;

FIG. 8A shows a sectional structure in a direction parallel to PL, and FIG. 8B shows a sectional structure in a direction parallel to WL;

FIG. 9A shows a sectional structure in a direction parallel to PL, and FIG. 9B shows a sectional structure in a direction parallel to WL;

FIG. 10A shows a sectional structure in a direction parallel to PL, and FIG. 10B shows a sectional structure in a direction parallel to WL;

FIG. 11A shows a sectional structure in a direction parallel to PL, and FIG. 11B shows a sectional structure in a direction parallel to WL;

FIG. 12A shows a sectional structure in a direction parallel to PL, and FIG. 12B shows a sectional structure in a direction parallel to WL;

FIG. 14A shows a sectional structure in a direction parallel to PL, and FIG. 14B shows a sectional structure in a direction parallel to WL;

FIG. 15A shows a sectional structure in a direction parallel to PL, and FIG. 15B shows a sectional structure in a direction parallel to WL;

FIG. 16A shows a sectional structure in a direction parallel to PL, and FIG. 16B shows a sectional structure in a direction parallel to WL;

FIG. 18A shows a sectional structure in a direction parallel to a plate line (PL) including a section cut along the line 18A-18A in FIG. 17, and FIG. 18B shows a sectional structure in a direction parallel to a word line (WL) including a section cut along the line 18B-18B in FIG. 17;

FIGS. 19A and 19B illustrate sectional structures to explain an example of a manufacturing process of the semiconductor device of the second embodiment; FIG. 19A shows a sectional structure in a direction parallel to PL indicated by the cut line 18A-18A in FIG. 17, and FIG. 19B shows a sectional structure in a direction parallel to WL indicated by the cut line 18B-18B in FIG. 17;

FIGS. 20A and 20B illustrate sectional structures to explain the example of the manufacturing process of the semiconductor device of the second embodiment subsequent to FIGS. 19A and 19B: FIG. 20A shows a sectional structure in a direction parallel to PL, and FIG. 20B shows a sectional structure in a direction parallel to WL;

FIG. 21A shows a sectional structure in a direction parallel to PL, and FIG. 21B shows a sectional structure in a direction parallel to WL;

FIGS. 22A and 22B illustrate sectional structures to explain the example of the manufacturing process of the semiconductor device of the second embodiment subsequent to FIGS. 21A and 21B: FIG. 22A shows a sectional structure in a direction parallel to PL, and FIG. 22B shows a sectional structure in a direction parallel to WL;

FIG. 23A shows a sectional structure in a direction parallel to PL, and FIG. 23B shows a sectional structure in a direction parallel to WL;

FIGS. 24A and 24B illustrate sectional structures to explain the example of the manufacturing process of the semiconductor device of the second embodiment subsequent to FIGS. 23A and 23B: FIG. 24A shows a sectional structure in a direction parallel to PL, and FIG. 24B shows a sectional structure in a direction parallel to WL;

FIGS. 25A and 25B illustrate sectional structures to explain the example of the manufacturing process of the semiconductor device of the second embodiment subsequent to FIGS. 24A and 24B: FIG. 25A shows a sectional structure in a direction parallel to PL, and FIG. 25B shows a sectional structure in a direction parallel to WL;

FIG. 26A shows a sectional structure in a direction parallel to PL, and FIG. 26B shows a sectional structure in a direction parallel to WL;

FIGS. 27A and 27B illustrate sectional structures to explain an example of a semiconductor device according to another modification of the second embodiment of the invention: FIG. 27A shows a sectional structure in a direction parallel to PL, and FIG. 27B shows a sectional structure in a direction parallel to WL;

FIGS. 28A and 28B illustrate sectional structures to explain an example of a semiconductor device according to yet another modification of the second embodiment of the invention: FIG. 28A shows a sectional structure in a direction parallel to PL, and FIG. 28B shows a sectional structure in a direction parallel to WL;

FIG. 29A shows a sectional structure in a direction parallel to PL, and FIG. 29B shows a sectional structure in a direction parallel to WL;

FIGS. 30A and 30B illustrate sectional structures to explain an example of a semiconductor device according to yet another modification of the second embodiment of the invention: FIG. 30A shows a sectional structure in a direction parallel to PL, and FIG. 30B shows a sectional structure in a direction parallel to WL;

DETAILED DESCRIPTION OF THE INVENTION

Figure 1:
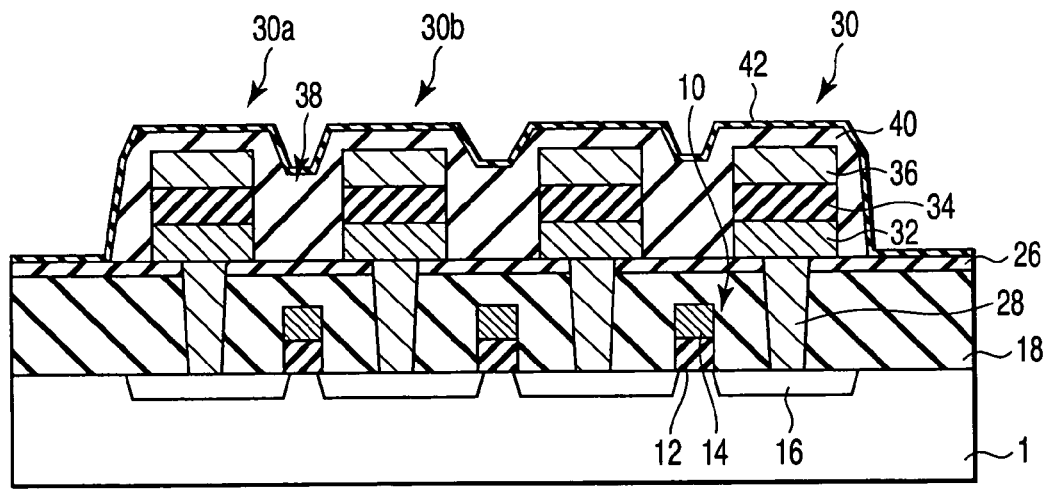
FIG. 1 illustrates a sectional structure to explain a concept of the present invention.

Embodiments of the present invention will be described in detail with reference to the accompanying drawings. Throughout the drawings, corresponding portions will be denoted by corresponding reference numerals.

To begin with, a basic concept of the present invention will be described with reference to FIG. 1. An example of a ferroelectric memory shown in FIG. 1 includes an array, which comprises a plurality of MOS transistors 10 formed on a semiconductor substrate 1, and a plurality of ferroelectric capacitors 30 closely formed above the MOS transistors 10. The array of the ferroelectric capacitors 30 is surrounded with a lower hydrogen barrier film 26 and an upper hydrogen barrier film 42, and has a structure to prevent penetration of hydrogen into the ferroelectric capacitors 30. Each ferroelectric capacitor 30 is formed on the lower hydrogen barrier film 26, and consisted of a lower electrode 32, a ferroelectric film 34, which is a capacitive insulator, and an upper electrode 36. Each of source/drains 16 of the MOS transistor 10 is connected to the ferroelectric capacitor 30 through a contact plug 28 formed in a first interlevel insulator 18 and lower hydrogen barrier film 26.

A second interlevel insulator 40, e.g., an $SiO_2$ film, is formed on the ferroelectric capacitor 30 by chemical vapor deposition (CVD) using $TEOS—O_3$, for example. A thickness t of the second interlevel insulator 40 is set to t>S/2, where S is a width of a space 38 between ferroelectric capacitors 30a, 30b. Thus, the space 38 between the capacitors is filled with the second interlevel insulator 40 in a self-aligned manner being planarised during formation thereof. When the second interlevel insulator is deposited to a sufficient thickness, the second interlevel insulator 40 formed on the upper electrode 36 can be thinned by etching-back. During the etching-back, outside the array of the ferroelectric capacitors 30, removal of the second interlevel insulator 40 is accepted to expose the lower hydrogen barrier film 26. The upper hydrogen barrier film 42 is formed on the planarised second interlevel insulator 40. Inside the capacitor array, since the underlying second interlevel insulator 40 has been planarised in a self-aligned manner, the upper hydrogen barrier film 42 can excellently cover the entire array of the adjacently formed ferroelectric capacitors 30. Further, outside the capacitor array, the lower hydrogen barrier film 26 and the upper hydrogen barrier film 42 are preferably formed in contact with each other. Accordingly, all the surroundings of the ferroelectric capacitors 30 array are covered with the hydrogen barrier films 26, 42, whereby high barrierhood can be obtained against the penetration of hydrogen. As a result, it is possible to prevent deterioration of characteristics of the ferroelectric capacitor 30.

Figure 2:
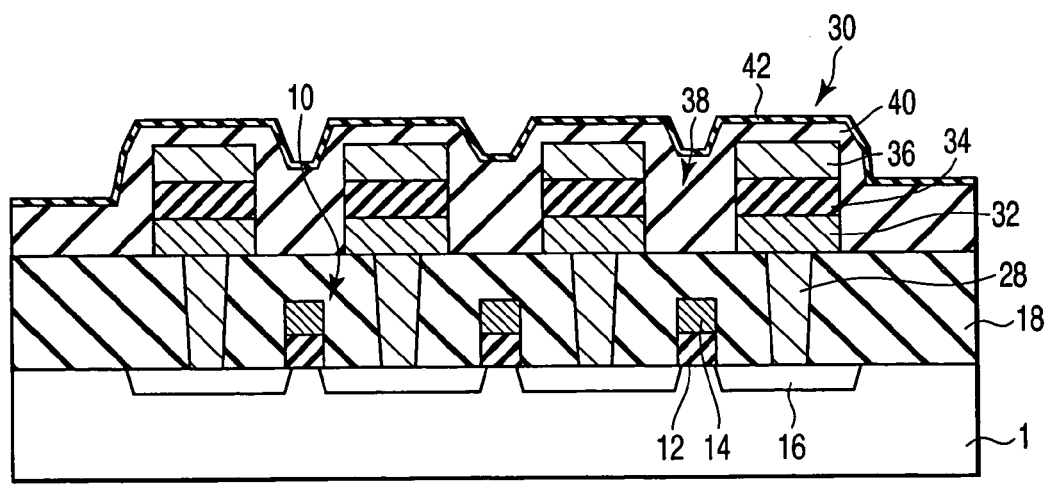
FIG. 2 illustrates another sectional structure to explain the concept of the invention.

FIG. 2 shows another example of a ferroelectric capacitor structure in which a hydrogen barrier film is simplified for an array of the ferroelectric capacitors 30, that is a lower hydrogen barrier film 26 formed below the ferroelectric capacitor 30 is omitted. According to this structure, inside the array of the adjacently formed ferroelectric capacitors 30, the space 38 between the capacitors is planarised in a self-aligned manner by a second interlevel insulator 40 as in the case of the example in FIG. 1. On the other hand, outside the array of the ferroelectric capacitors 30, an effect of preventing the penetration of hydrogen is improved by forming the upper hydrogen barrier film 42 to be sufficiently wide. As a result, barrierhood can be improved against the penetration of hydrogen into the array of the ferroelectric capacitors 30 during a subsequent manufacturing process, whereby deterioration of characteristics of the ferroelectric capacitor 30 can be prevented.

FIRST EMBODIMENT

A first embodiment is an example in which inside an array of adjacently formed ferroelectric capacitors 30, a space 38 between the capacitors 30 is planarised by an interlevel insulator 40 in a self-aligned manner, and then a hydrogen barrier film 42 is formed with excellent coverage.

FIG. 3 is a plan view showing an example of the array of the ferroelectric capacitors 30 of the first embodiment. An array of four capacitor cells (CELLs 11 to 22) is shown in the drawing. One capacitor cell (e.g., CELL 11) includes one MOS transistor 10 (TR 11) and one ferroelectric capacitor 30 (CP 11). Further, as shown, a plate line 50 (PL 1) and a bit line 22 (BL 1), which are extended horizontally, and a word line 14 (WL 1), which is extended vertically, are included.

Figure 4A:
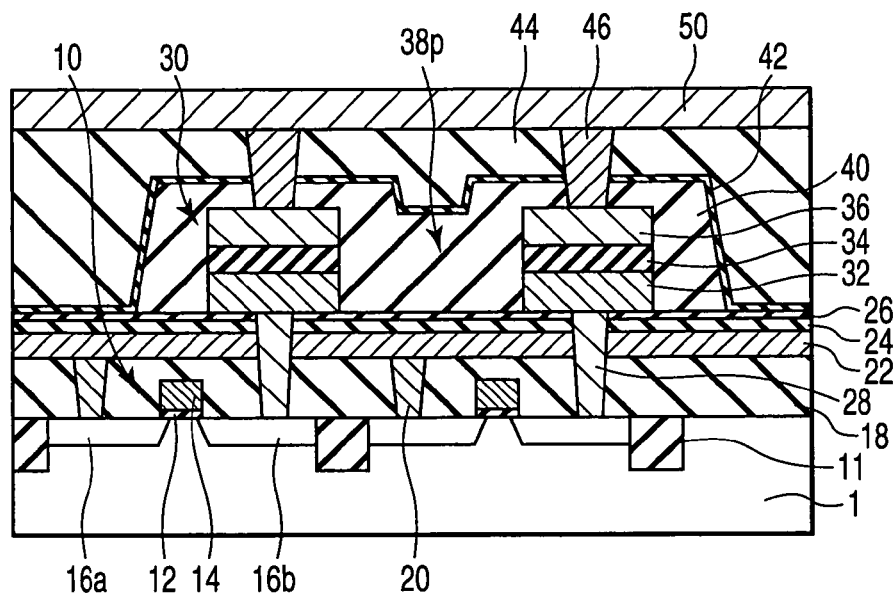
FIGS. 4A and 4B illustrate sectional structures to explain the example of the semiconductor device of the first embodiment of the invention.
Figure 4B:
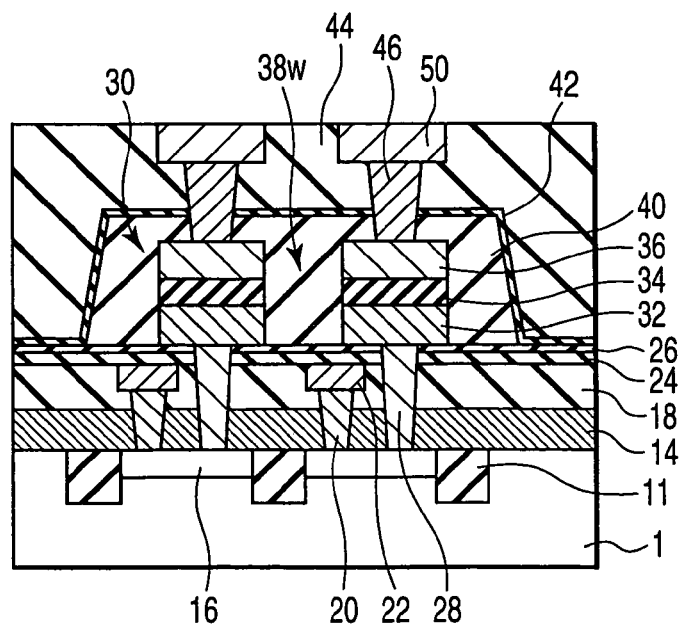

FIGS. 4A and 4B are views illustrating sectional structures of the array of the ferroelectric capacitors 30 of the first embodiment: FIG. 4A shows a sectional structure in a direction parallel to PL 50 including a section cut along a line 4A-4A in FIG. 3, and FIG. 4B shows a sectional structure in a direction parallel to WL 14 including a section cut along a line 4B-4B in FIG. 3. In FIG. 4A, the PL 50 and the BL 22 are formed on different sections in a direction perpendicular to a paper surface, but shown simultaneously to simplify the description. Similarly, in FIG. 4B, a first contact plug 20, a second contact plug 28, and a gate electrode 14 (WL) are formed on different sections in a direction perpendicular to a paper surface, but shown simultaneously for convenience.

As shown in FIGS. 4A and 4B, the ferroelectric capacitor 30 is formed on a lower hydrogen barrier film 26, and comprises a lower electrode 32, a ferroelectric film 34 as a capacitive insulator, and an upper electrode 36. The array of the ferroelectric capacitors 30 is covered with an upper hydrogen barrier film 42, and entirely surrounded by the hydrogen barrier films 26, 42. The lower electrode 32 of the ferroelectric capacitor 30 is connected to a source/drain 16b of the MOS transistor 10 through a second contact plug 28. The upper electrode 36 of the ferroelectric capacitor 30 is connected to the PL 50 through a third contact plug 46. The other source/drain 16a of the MOS transistor 10 is connected to the BL 22 through a first contact plug 20. The BL 22 is formed in a level lower than that of the ferroelectric capacitor 30.

According to the embodiment, all the spaces between the capacitors in the capacitor array are planarised by the third interlevel insulator 40 in a self-aligned manner during formation thereof. That is, not only a narrowest space 38w between the adjacent ferroelectric capacitors 30 in a direction parallel to WL, e.g., between CP 11 and CP 21 or between CP 12 and CP 22 in FIG. 3, but also a space 38p between the ferroelectric capacitors 30 in a direction parallel to the PL, e.g., between CP 11 and CP 12, or between CP 21 and CP 22, are planarised. As a result, the upper hydrogen barrier film 42 formed on the third interlevel insulator 40 can sufficiently cover the array of the ferroelectric capacitors 30, even in a space between the capacitors whose coverage has been poor according to the conventional art, especially the space 38w.

A manufacturing process of the semiconductor device according to the first embodiment will be described with reference to FIGS. 5A to 12B. These drawings are illustrated to explain sectional structures, therefore all elements shown are not presented on the same section, as in the case of FIGS. 4A, 4B, but shown simultaneously to simplify the description. Each drawings A of FIGS. 5A to 12A illustrate sectional structures in a direction parallel to PL, while each drawings B of FIGS. 5B to 12B illustrate sectional structures in a direction parallel to WL perpendicular to the drawings A.

Figure 5A:
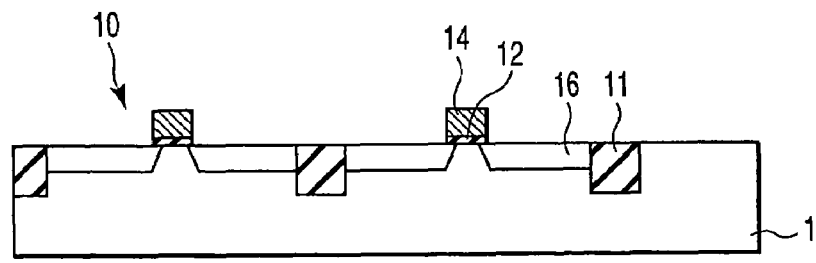
FIGS. 5A and 5B illustrate sectional structures to explain an example of a manufacturing process of the semiconductor device of the first embodiment.
Figure 5B:
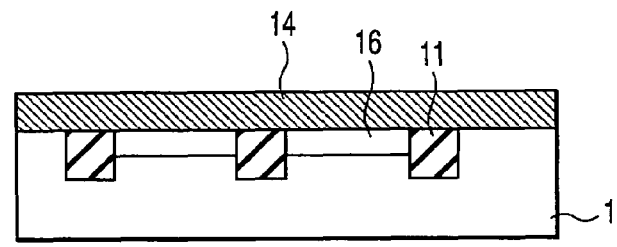

(1) First, a MOS transistor 10 is formed on the semiconductor substrate 1. As shown in FIGS. 5A, 5B, an isolation 11 is formed in the semiconductor substrate 1, and a gate insulator 12 is formed on an entire surface. For the gate insulator 12, a silicon oxide ($SiO_2$) film, a silicon nitride (SiN) film, a silicon oxi-nitride (SiON) film, or a high dielectric constant insulator, such as a tantalum oxide ($Ta_2O_5$) film, having a dielectric constant higher than that of the $SiO_2$ film can be used. A conductive material for a gate electrode 14, e.g., a polysilicon film doped with phosphorus (P) or boron (B) in a high concentration, is deposited on the gate insulator 12. This polysilicon film is processed to form a gate electrode 14 by lithography and etching. For the gate electrode 14, in addition to the polysilicon, for example, a high melting point metal such as tungsten (W) or molybdenum (Mo), or a silicide of such a metal can be used. The gate electrode 14 connects the MOS transistors 10 through the capacitor cells in one direction (vertical direction in the drawing) as shown in FIG. 3, and serves as a word line (WL). Then, a source/drain 16 is formed using the gate electrode 14 as a mask.

Figure 6A:
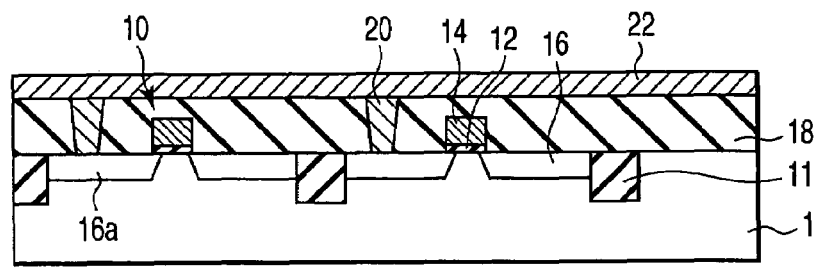
FIGS. 6A and 6B illustrate sectional structures to explain the example of the manufacturing process of the semiconductor device of the first embodiment subsequent to FIGS. 5A and 5B.
Figure 6B:
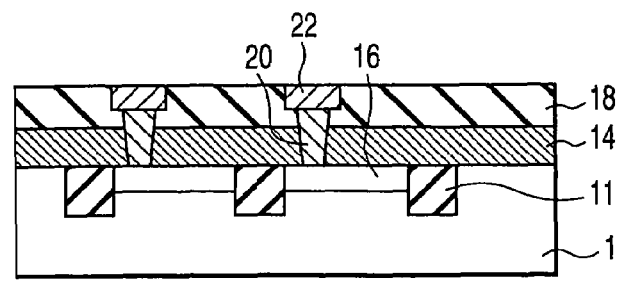

(2) Next, a first contact plug 20 is formed to connect a bit line (BL) 22 to be formed above the MOS transistor 10 with one source/drain 16a of the MOS transistor 10. Specifically, as shown in FIGS. 6A, 6B, a first interlevel insulator 18 is deposited on an entire surface, and then planarised by, e.g., CMP. A first contact hole, which reaches to one source/drain 16a of the MOS transistor 10, and a trench for BL are formed in the first interlevel insulator 18 by lithography and etching. For example, phosphorus-doped polysilicon or tungsten (W) is deposited to fill the first contact hole and the trench for BL. The deposit on the surface of the first interlevel insulator 18, e.g., the polysilicon, is removed by, e.g., CMP, thus the first contact plug 20 and BL 22 are formed.

Figure 7A:
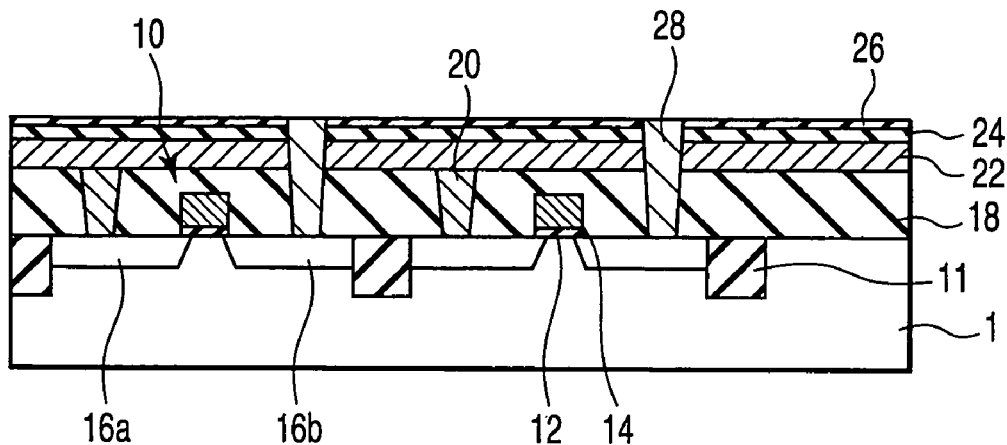
FIGS. 7A and 7B illustrate sectional structures to explain the example of the manufacturing process of the semiconductor device of the first embodiment subsequent to FIGS. 6A and 6B.
Figure 7B:
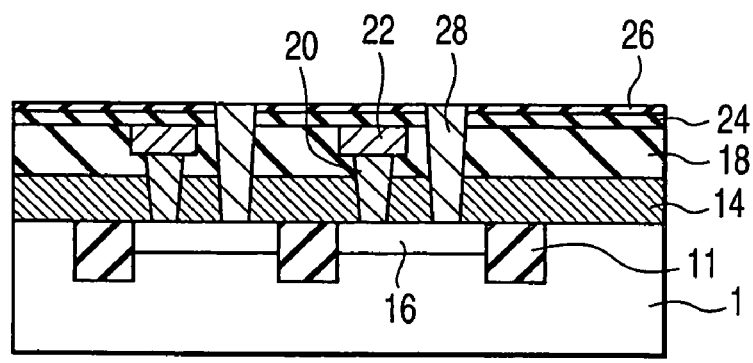

(3) Next, a lower hydrogen barrier film 26 is formed, and a second contact plug 28 is formed to connect a lower electrode 32 of a ferroelectric capacitor 30 with the other source/drain 16b of the MOS transistor 10. Specifically, as shown in FIGS. 7A, 7B, a second interlevel insulator 24 is formed on an entire surface, and then the lower hydrogen barrier film 26 is formed thereon. For the lower hydrogen barrier film 26, an aluminum oxide ($Al_2O_3$), a silicon nitride (SiN), a silicon oxi-nitride (SiON), a titanium oxide ($TiO_2$) or the like can be used. A second contact hole is formed in the lower hydrogen barrier film 26, the second interlevel insulator 24, and the first interlevel insulator 18 by lithography and etching to be connected to the source/drain 16b. For example, phosphorus-doped polysilicon is deposited to fill the second contact hole. The deposit, e.g., the polysilicon, on a surface of the lower hydrogen barrier film 26 is removed by, e.g., CMP, thus a second contact plug 28 is formed. In FIGS. 7A, 7B, the first contact plug 20 and the second contact plug 28 are shown as they are on the same section. In practice, however, both are formed on different sections in both FIGS. 7A, 7B.

Figure 8A:
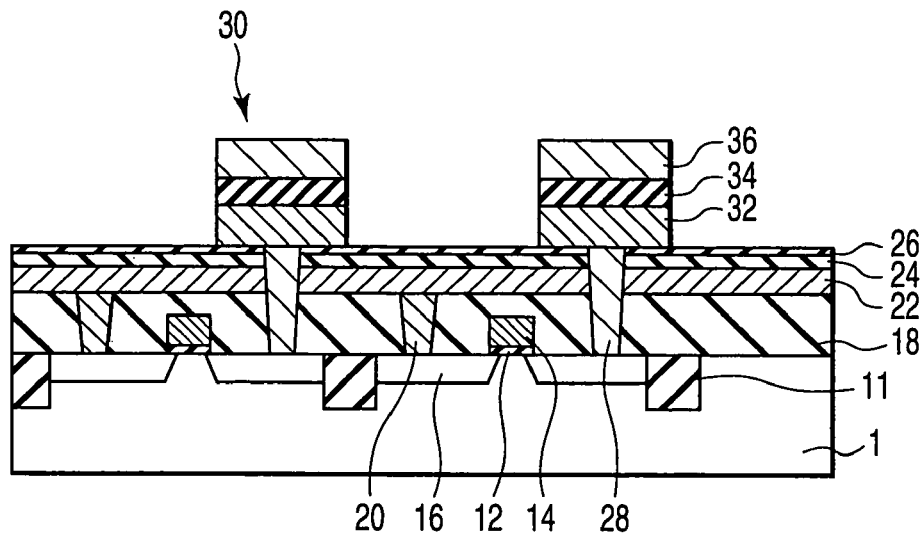
FIGS. 8A and 8B illustrate sectional structures to explain the example of the manufacturing process of the semiconductor device of the first embodiment subsequent to FIGS. 7A and 7B.
Figure 8B:
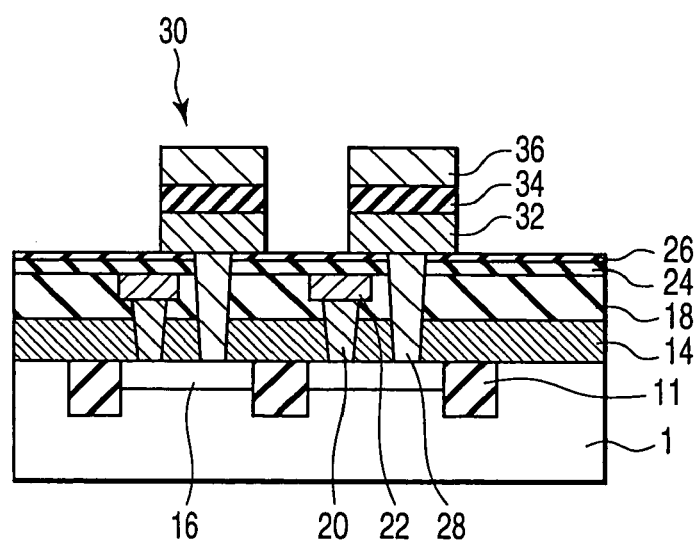

(4) Next, a ferroelectric capacitor 30 is formed. Specifically, as shown in FIGS. 8A, 8B, materials for a lower electrode 32, a ferroelectric film 34, and an upper electrode 36 are formed sequentially on an entire surface of the lower hydrogen barrier film 26. For the lower electrode 32 of the ferroelectric capacitor 30, a conductive film having an oxygen barrier capability is preferred, and there can be used a material containing, e.g., iridium (Ir), iridium oxide ($IrO_2$), ruthenium (Ru), ruthenium oxide ($RuO_2$), or platinum (Pt). For the ferroelectric film 34, a metal oxide having a perovskite structure, e.g., lead zirconate titanate (PZT), or strontium bismuth tantalate (SBT), can be used. For the upper electrode 36, e.g., Ir, $IrO_2$, Ru, $RuO_2$, or Pt can be used. Subsequently, the upper electrode 36, the ferroelectric film 34, and the lower electrode 32 are processed by lithography and etching to form a ferroelectric capacitor 30.

Figure 9A:
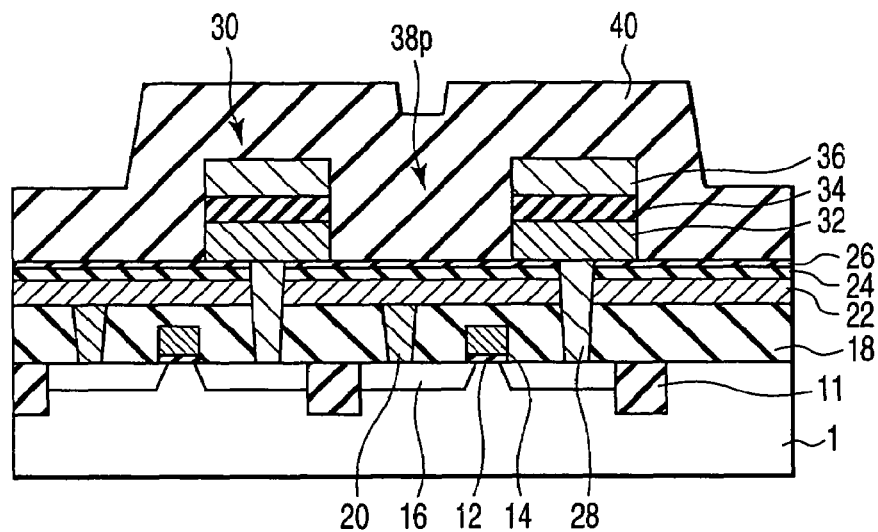
FIGS. 9A and 9B illustrate sectional structures to explain the example of the manufacturing process of the semiconductor device of the first embodiment subsequent to FIGS. 8A and 8B.
Figure 9B:
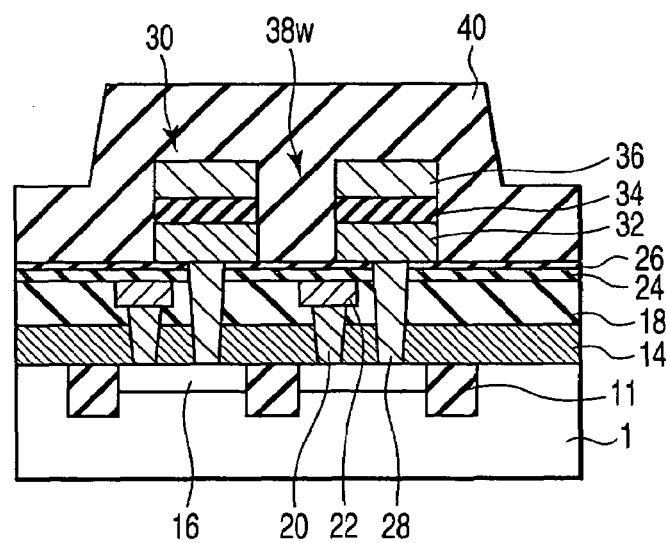

(5) Next, spaces 38w, 38p between the ferroelectric capacitors 30 are planarised by a third interlevel insulator 40 in a self-aligned manner. These spaces can be planarised in a self-aligned manner by depositing the third interlevel insulator 40 with a thickness to sufficiently fill the wider space 38p. Deposition condition of the third interlevel insulator 40 necessary for planarizing the spaces is as follows. The third interlevel insulator 40 is deposited isotropically with a thickness larger than ½ of a width of a space 38p, whereby spaces 38p and 38w are planarised in a self-aligned manner. Setting widths of the spaces 38w and 38p between the ferroelectric capacitors 30 as Sw and Sp, respectively, a relation Sp>Sw is given. By setting a thickness of the third interlevel insulator 40 necessary for planarizing the spaces 38p with t, the thickness t is given by t>Sp/2. By forming the third interlevel insulator 40 as described above, the entire array of the ferroelectric capacitors 30 can be planarised as shown in FIGS. 9A, 9B. For the third interlevel insulator 40, e.g., a CVD-$SiO_2$ film using TEOS—$O_3$ that can be isotropically deposited at a low temperature can be used.

Figure 10A:
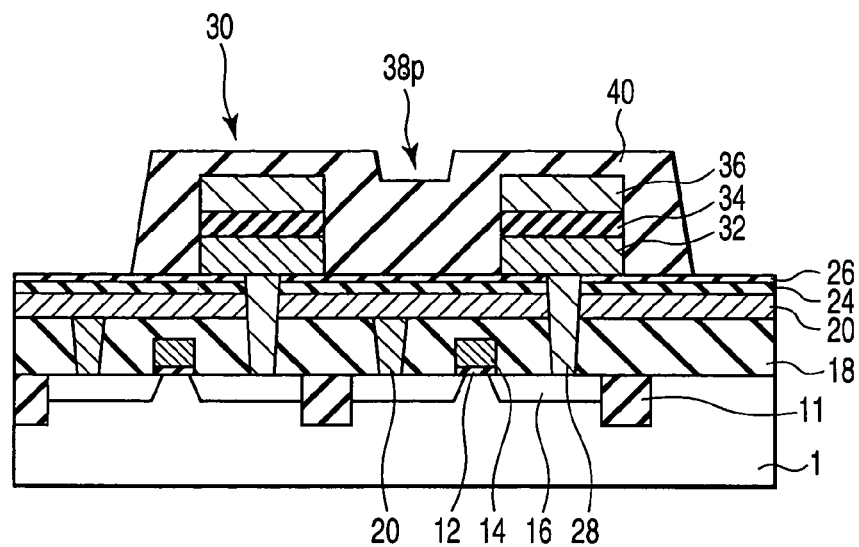
FIGS. 10A and 10B illustrate sectional structures to explain the example of the manufacturing process of the semiconductor device of the first embodiment subsequent to FIGS. 9A and 9B.
Figure 10B:
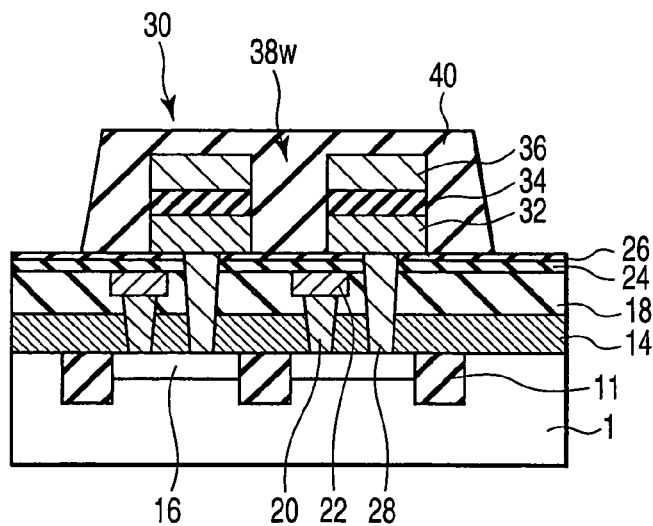

(6) Then, the third interlevel insulator 40 is etched back. The etching-back enables thinning of the third interlevel insulator 40 on the upper electrode 36, and smoothing of the surface. During the etching-back, as shown in FIGS. 10A, 10B, the third interlevel insulator 40 is preferably removed to expose the lower hydrogen barrier film 26 outside of the array of the ferroelectric capacitors 30. A similar effect can be obtained by making the third interlevel insulator 40 sufficiently thin on the lower hydrogen barrier film 26.

Figure 11A:
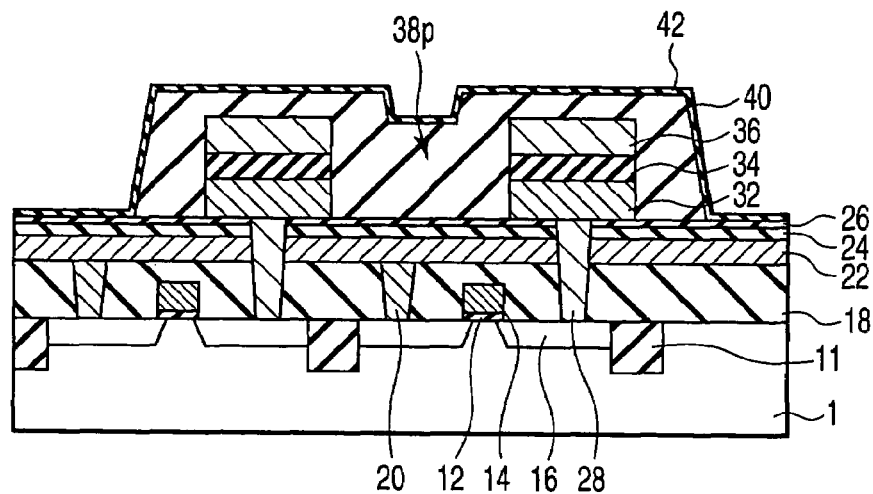
FIGS. 11A and 11B illustrate sectional structures to explain the example of the manufacturing process of the semiconductor device of the first embodiment subsequent to FIGS. 10A and 10B.
Figure 11B:
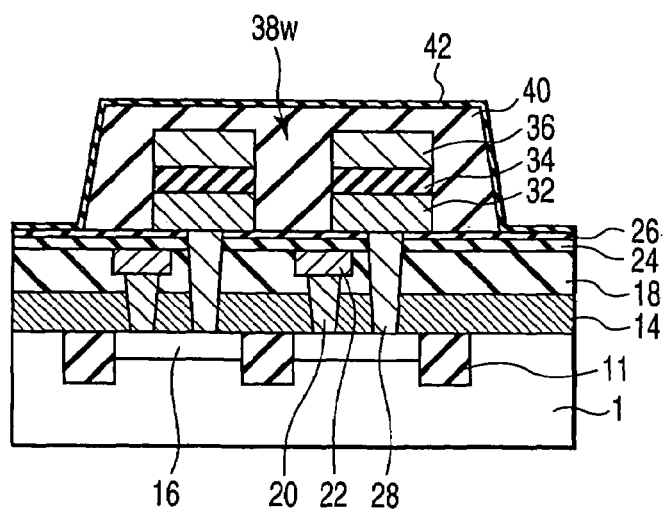

(7) For example, an aluminum oxide ($Al_2O_3$) film is formed as an upper hydrogen barrier film 42 on the third interlevel insulator 40 by sputtering. The sputtering has characteristics that coverage is poorer if a ratio (aspect ratio) between a depth and a width of a space is larger. However, as shown in FIGS. 11A, 11B, since the surface of the third interlevel insulator 40 is planarised, the upper hydrogen barrier film 42 can be formed with excellent coverage even on the space 38w with a large aspect ratio. For the hydrogen barrier film 42, SiN, SiON, $TiO_2$ or the like can be used in addition to $Al_2O_3$.

Figure 12A:
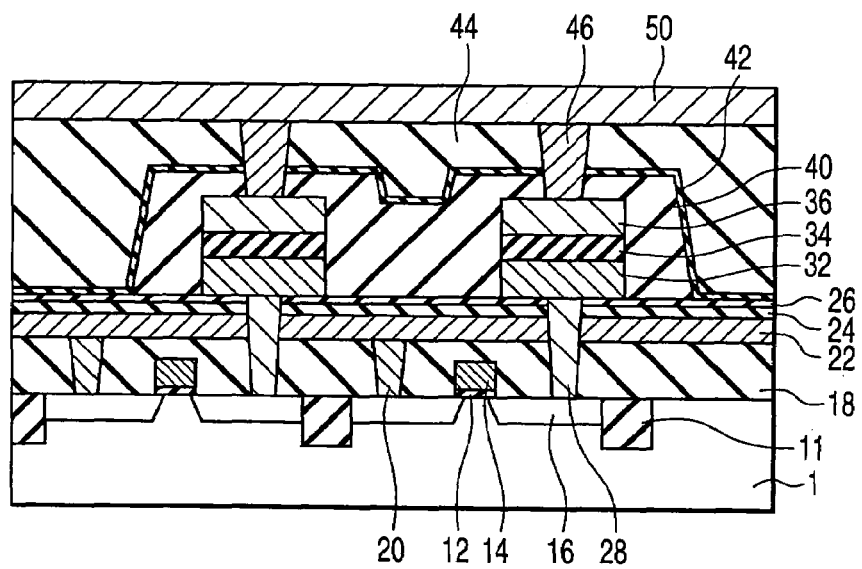
FIGS. 12A and 12B illustrate sectional structures to explain the example of the manufacturing process of the semiconductor device of the first embodiment subsequent to FIGS. 11A and 11B.
Figure 12B:
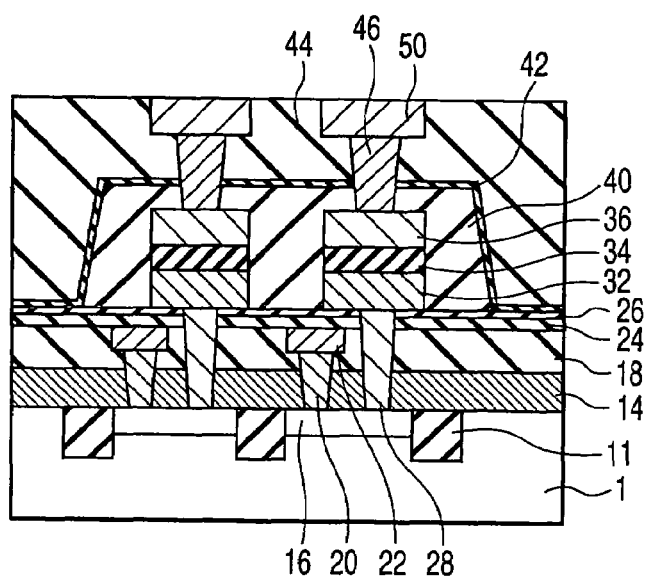

(8) Next, a third contact plug 46 is formed to be connected the upper electrode 36 with a plate line (PL) 50 to be formed above the upper electrode 36. Specifically, as shown in FIGS. 12A, 12B, a fourth interlevel insulator 44 is deposited on an entire surface, and planarised by, e.g., CMP. A third contact hole is formed in the fourth interlevel insulator 44 and the upper hydrogen barrier film 42 to reach the upper electrode 36. Further, a trench for PL is formed in the fourth interlevel insulator 44. For example, phosphorus-doped polysilicon or W is deposited to fill the third contact hole and the trench for PL. The deposit, e.g., the polysilicon, on a surface of the fourth interlevel insulator 44 is removed by, e.g., CMP, thus the third contact plug 46 and the PL 50 are formed.

Subsequently, a step of multilevel wiring or the like necessary for the semiconductor device is carried out to complete the semiconductor device which comprises the ferroelectric memory.

Figure 13:
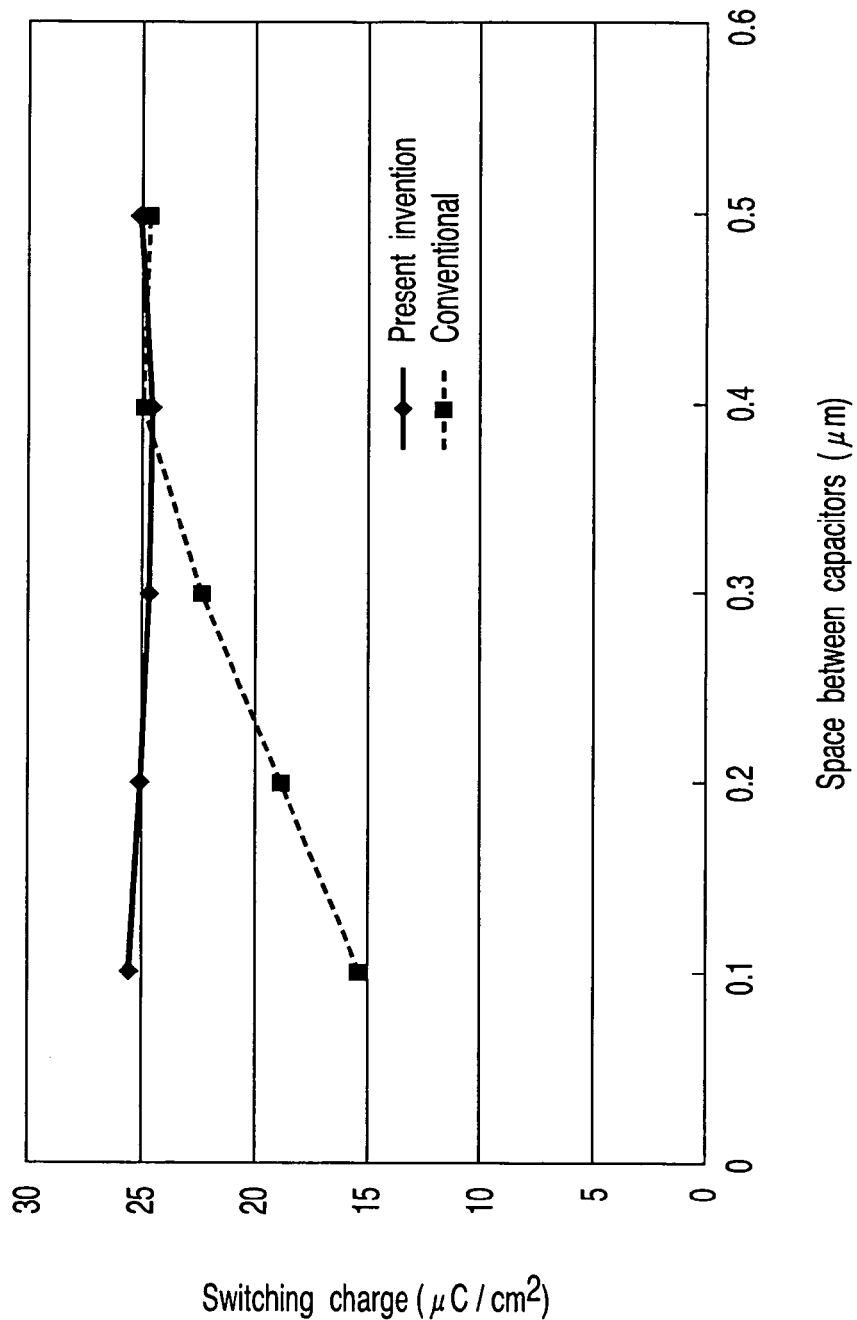
FIG. 13 illustrates switching charge characteristics of the semiconductor device of the first embodiment of the invention.

Electric characteristics of a ferroelectric memory formed in the aforementioned manner have been evaluated. FIG. 13 shows an example of switching charge characteristics with respect to a space between the capacitors, wherein a solid line represents characteristics of the semiconductor device of the embodiment, and a broken line represents characteristics of a semiconductor device of a conventional art shown as a reference. As apparent from the drawing, no deterioration occurs in switching charge characteristics according to the embodiment even in a case of the space between the capacitors of 0.4 μm or less, which causes deterioration of the characteristics in the conventional art. This means that the problems of the conventional art can be solved by the embodiment. That is, even if a space 38 between the capacitors becomes narrower, the space between the capacitors can be planarised by the third interlevel insulator 40 in a self-aligned manner, thus the upper hydrogen barrier film 42 can be formed with excellent coverage. As a result, it is possible to prevent penetration of hydrogen into the ferroelectric capacitors 30 in the manufacturing process of the semiconductor device after the formation thereof, and characteristics, e.g., polarization characteristics, of the ferroelectric capacitor 30 are not deteriorated.

MODIFICATION OF FIRST EMBODIMENT

Various modifications and simplification can be made for the first embodiment. Some examples are described below.

Figure 14A:
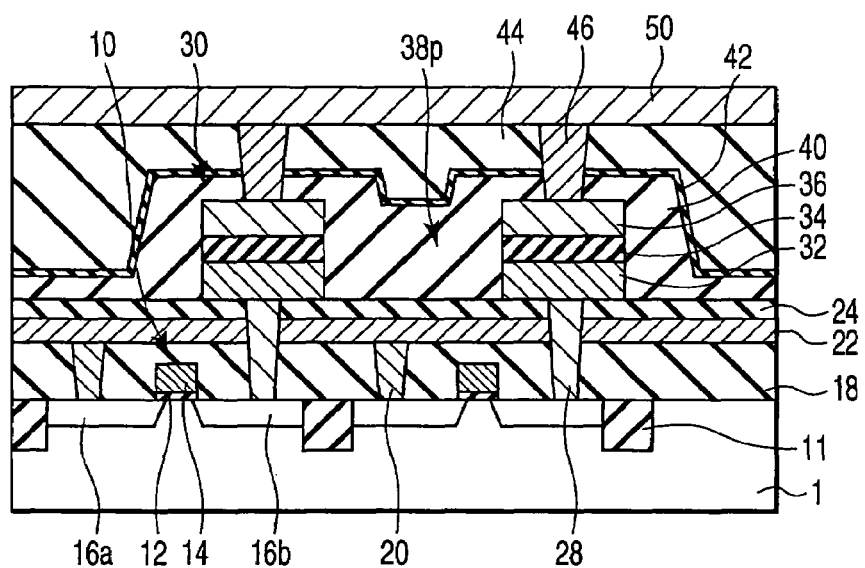
FIGS. 14A and 14B illustrate sectional structures to explain an example of a semiconductor device according to a modification of the first embodiment of the invention.
Figure 14B:
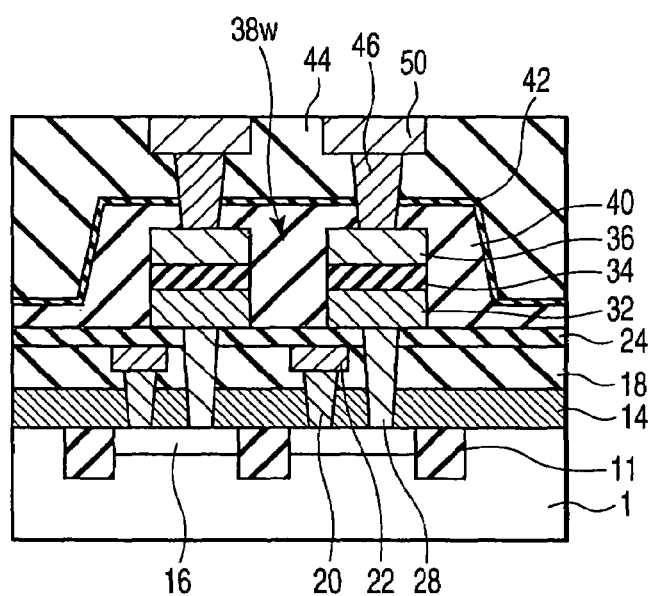

FIGS. 14A, 14B show a modification of the first embodiment in which the lower hydrogen barrier film 26 is omitted for simplification: FIG. 14A shows a sectional structure in a direction parallel to PL 50, and FIG. 14B shows a sectional structure in a direction parallel to WL 14 perpendicular to FIG. 14A. According to this modification, inside an array of ferroelectric capacitors 30, coverage of the capacitor array with an upper hydrogen barrier film 42 is excellent, since spaces between the capacitors are planarised in a self-aligned manner during formation of a third interlevel insulator 40. Thus, there is a sufficient barrier capability against penetration of hydrogen into the ferroelectric capacitors 30 from above. Hydrogen penetration may possibly occur in a horizontal direction. However, by forming the upper hydrogen barrier film 42 to be sufficiently wide outside of the capacitor array, it is possible to suppress the penetration of hydrogen into the ferroelectric capacitors 30 in the manufacturing process after formation thereof.

Figure 15A:
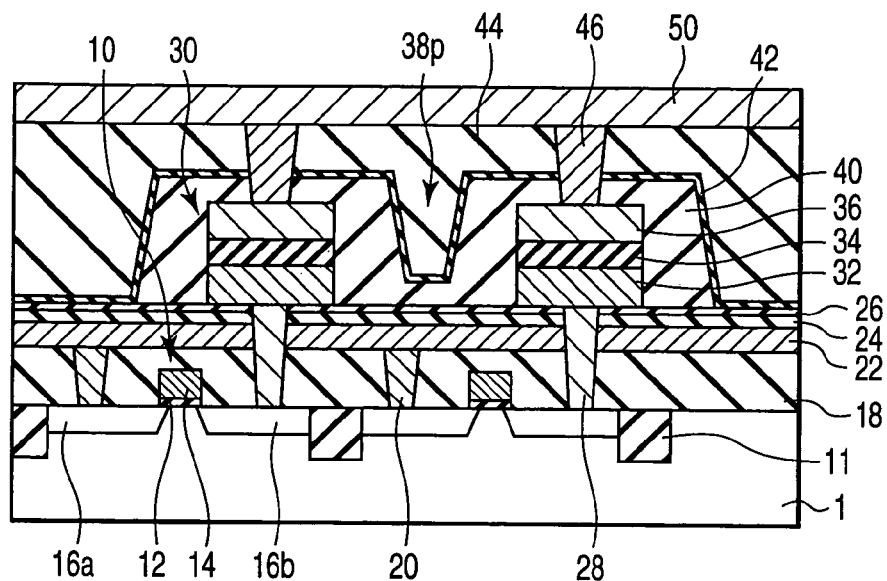
FIGS. 15A and 15B illustrate sectional structures to explain an example of a semiconductor device according to another modification of the first embodiment of the invention.
Figure 15B:
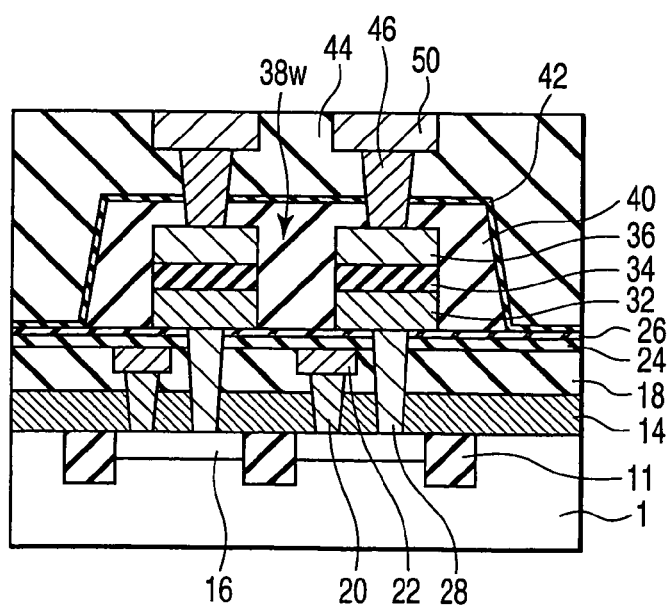

FIGS. 15A, 15B show another modification in which, in adjacent capacitors of an array of ferroelectric capacitors 30, only a space 38w, which has a larger aspect ratio and lies between the capacitors in a direction parallel to WL 14, is planarised in a self-aligned manner during formation of a third interlevel insulator 40. FIG. 15A illustrates a sectional structure in a direction parallel to PL 50, and FIG. 15B illustrates a sectional structure in a direction parallel to WL 14 perpendicular to FIG. 15A. According to this modification, as shown in FIG. 15B, the space 38w being planarised is a space in which an aspect ratio is large, and coverage with an upper hydrogen barrier film 42 is likely to become poorer. However, because the space 38w has a narrow width Sw, a thickness t(w) of the third interlevel insulator 40 necessary for planarizing the space 38w in a self-aligned manner can be set thinner. The thickness t(w) is given by t(w)>Sw/2. Then, it is given t(w)<t because of Sw<Sp. Thus the third interlevel insulator 40 in the modification can be made thinner than that of the first embodiment. While at a space 38p having a wider space in the direction of PL 50, an aspect ratio is not increased even if the third interlevel insulator 40 with a thickness above is formed. Therefore, the upper hydrogen barrier film 42 can be formed with an acceptable coverage even if it is not fully planarised. Forming the third interlevel insulator 40 thinner provides several advantages not only simply shortening a deposition time thereof but also reducing frequency of CVD equipment maintenance, and the like. The modification is therefore advantageous for improving overall throughput in manufacturing of the semiconductor device or the like. According to the described structure, since the ferroelectric capacitors 30 are formed on a lower hydrogen barrier film 26, the entire array thereof is surrounded with the hydrogen barrier films 26, 42 as in the case of the first embodiment.

Figure 16A:
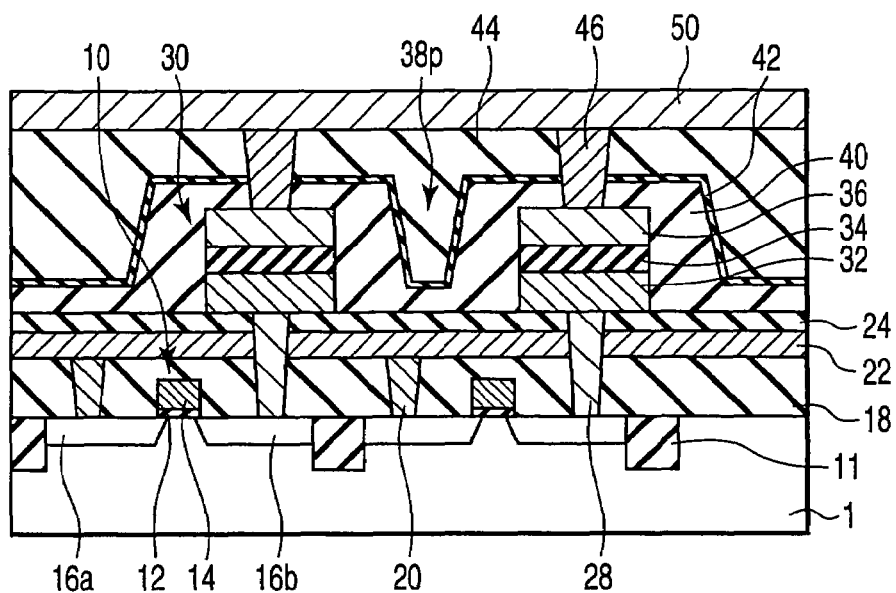
FIGS. 16A and 16B illustrate sectional structures to explain an example of a semiconductor device according to yet another modification of the first embodiment of the invention.
Figure 16B:
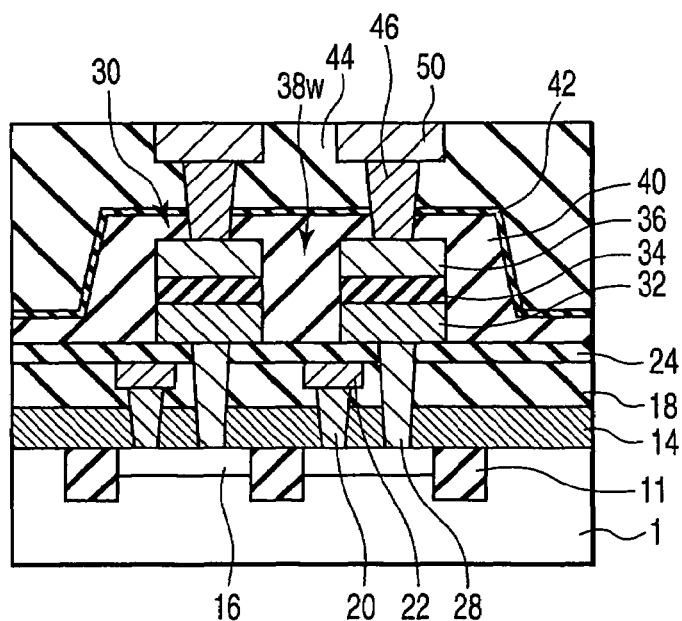

FIGS. 16A, 16B show yet another modification in which the lower hydrogen barrier film 26 is omitted from the structure shown in FIGS. 15A, 15B: FIG. 16A shows a sectional structure in a direction parallel to PL 50, and FIG. 16B shows a sectional structure in a direction parallel to WL 14 perpendicular to FIG. 16A. According to this modification, only a space 38w between capacitors in an array of ferroelectric capacitors 30 in a direction parallel to WL is planarised in a self-aligned manner during formation of a third interlevel insulator 40. In this case as in the above, by forming an upper hydrogen barrier film 42 to be sufficiently wide outside of the capacitor array, it is possible to suppress penetration of hydrogen into the ferroelectric capacitors 30 in the manufacturing process after formation thereof.

SECOND EMBODIMENT

Figure 17:
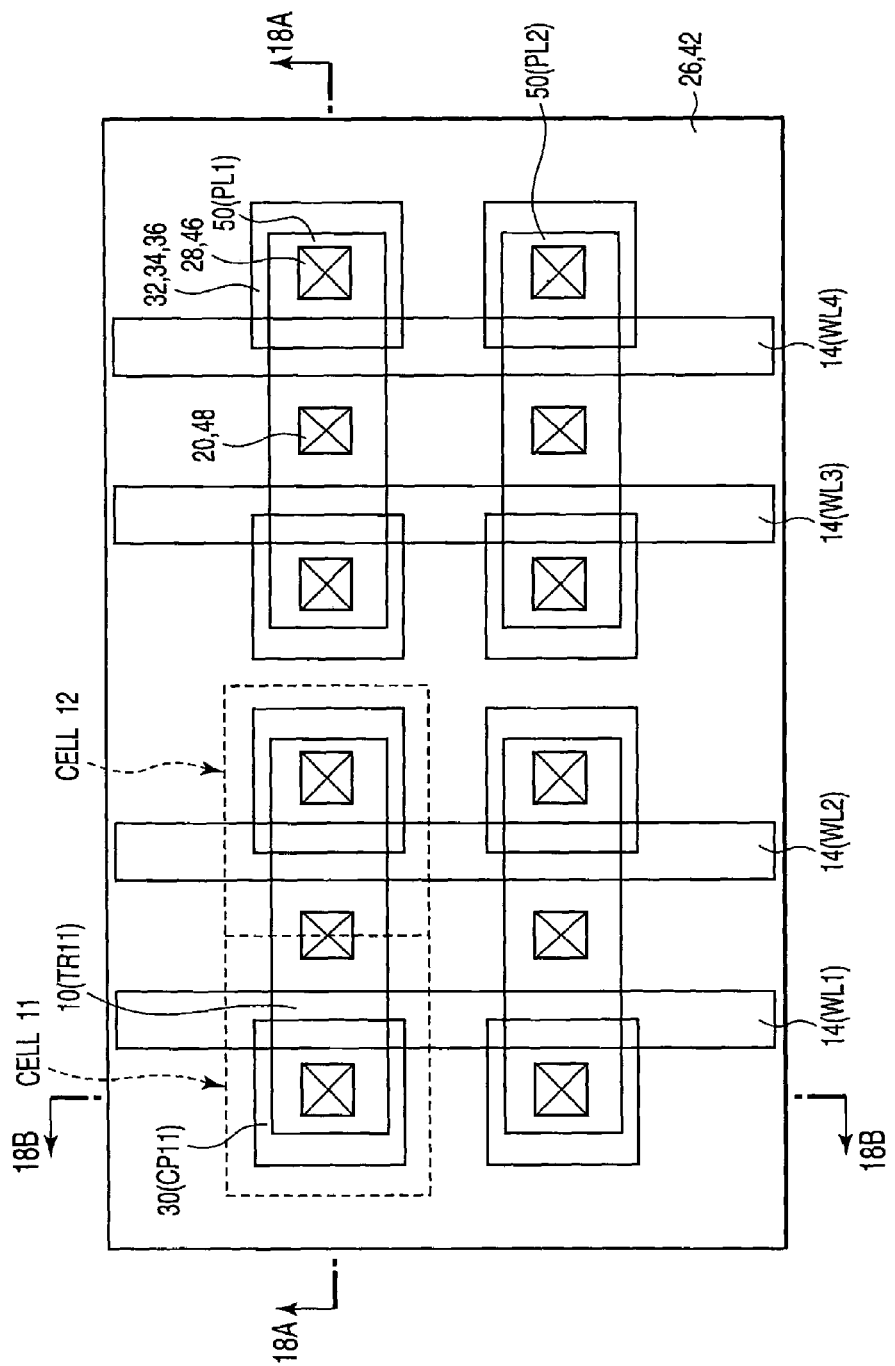
FIG. 17 is a plan view shows an example of a semiconductor device according to a second embodiment of the present invention.
Figures 18A, 18B:
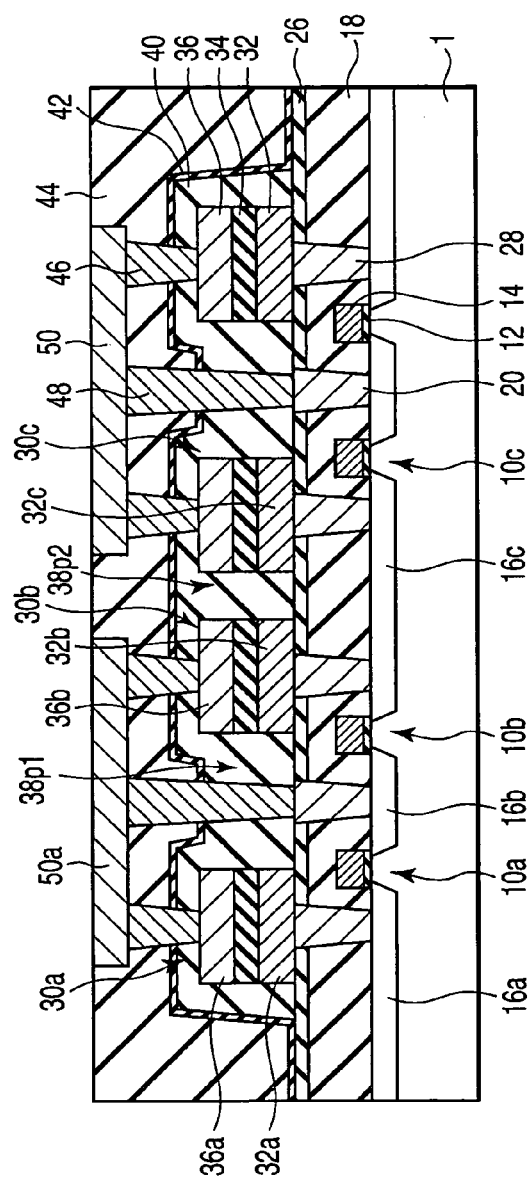
FIGS. 18A and 18B illustrate sectional structures to explain the example of the semiconductor device of the second embodiment of the invention.

A second embodiment is an example of application to a transistor-capacitor (TC) parallel unit serial connection ferroelectric memory. FIG. 17 is a plan view, and FIGS. 18A and 18B are views illustrating sectional structures: FIG. 18A shows a sectional structure in a direction parallel to PL 50 which includes a section cut along a line 18A-18A in FIG. 17, and FIG. 18B shows a sectional structure in a direction parallel to WL 14 which includes a section cut along a line 18B-18B in FIG. 17. FIGS. 18A and 18B are illustrated to explain sectional structures, thus elements (shown) are not all present on the same section, but shown simultaneously to simplify the description.

FIG. 17 shows eight TC parallel unit cells. One TC parallel unit cell (e.g., CELL 11) includes one MOS transistor (TR 11) and one ferroelectric capacitor (CP 11) which are connected in parallel. As shown in FIG. 18A, for example, one source/drain 16a of a MOS transistor 10a is connected to a lower electrode 32a of a ferroelectric capacitor 30a, and the other source/drain 16b thereof is connected to an upper electrode 36a of the ferroelectric capacitor 30a through a PL 50a. The TC parallel unit serial connection type ferroelectric memory is constructed by serially connecting the unit cells.

The connection is described below. MOS transistors 10a and 10b share a source/drain 16b. Upper electrodes 36a and 36b of ferroelectric capacitors 30a and 30b are commonly connected through PL 50a. Lower electrodes 32b and 32c of ferroelectric capacitors 30b and 30c are commonly connected to a source/drain 16c of the MOS transistor 10b. This source/drain 16c is shared by MOS transistors 10b and 10c. Repeating connections described above, the TC parallel unit serial connection type ferroelectric memory is formed.

According to the embodiment, in an array of TC parallel unit serial connection type ferroelectric capacitors, coverage of the capacitors 30 with an upper hydrogen barrier film 42 is improved by planarizing a second interlevel insulator 40 in a self-aligned manner during formation. The second interlevel insulator 40 is formed to planarise all spaces 38p1, 38p2, and 38w with different widths (see FIGS. 18A, 18b) between the ferroelectric capacitors 30. Since the ferroelectric capacitors 30 are formed on a lower hydrogen barrier film 26, a structure is made in which surroundings of the ferroelectric capacitor array are all covered with the hydrogen barrier films 26, 42.

A manufacturing process of the semiconductor device of the second embodiment will be described with reference to FIGS. 19A, 19B to FIGS. 25A, 25B. As in the case of FIGS. 18A, 18B, these drawings are illustrated to explain sectional structures, thus elements (shown) are not all present on the same section, but shown simultaneously to simplify the description. Each drawings A of FIGS. 19A to 25A illustrate sectional structures parallel to PL 50, while each drawings B of FIGS. 19B to 25B illustrate sectional structures parallel to WL 14 perpendicular to the drawings A. Materials similar to those of the first embodiment can be used.

(1) FIGS. 19A, 19B show a MOS transistor 10 formed on a semiconductor substrate 1. The manufacturing process is similar to that of the first embodiment shown in FIGS. 5A, 5B while only patterns are different, and thus detailed description will be omitted. In the drawings, an isolation 11, a gate insulator 12, a gate electrode 14, and a source/drain 16 are shown. MOS transistors 10a and 10b are formed to share a source/drain 16b, and MOS transistors 10b and 10c are formed to share a source/drain 16c.

(2) Next, first and second contact plugs 28, 20 are formed being connected to a ferroelectric capacitor 30 formed above the MOS transistor 10 with the source/drain 16 thereof. Specifically, as shown in FIGS. 20A, 20B, a first interlevel insulator 18 is deposited on an entire surface, and planarised by, e.g., CMP. Subsequently, a lower hydrogen barrier film 26 is formed on an entire surface. First and second contact holes are formed in the lower hydrogen barrier film 26 and the first interlevel insulator 18 by lithography and etching to be connected a lower electrode 32 and an upper electrode 36 of the ferroelectric capacitor 30 with the source/drain 16. Then, for example, phosphorus-doped polysilicon is deposited on an entire surface to fill the contact holes. The polysilicon deposited on a surface of the lower hydrogen barrier film 26 is removed by, e.g., CMP. In this way, the first contact plug 28 is formed to be connected the lower electrode 32 of the ferroelectric capacitor 30 with one source/drain 16 of the MOS transistor 10, and the second contact plug 20 is formed to be connected the upper electrode 36 with the other source/drain 16. To form a TC parallel unit serial connection ferroelectric memory, the first contact plug 28 is formed in each of odd-numbered sources/drains 16a, 16c, and 16e of a serially arranged transistors as shown in FIG. 20A. The first contact plug 28 is formed to be connected the lower electrode 32 of the ferroelectric capacitor 30 with source/drain 16 of the MOS transistor 10. On the odd-numbered source/drain 16c in FIG. 20A excluding the sources/drains 16a and 16e on the both ends, two first contact plugs 28b, 28c are formed to be connected to two ferroelectric capacitors 30. On the even-numbered sources/drains 16b, 16d, second contact plugs 20 are formed to be connected to the upper electrode 36 of the ferroelectric capacitor 30.

Figure 21A:
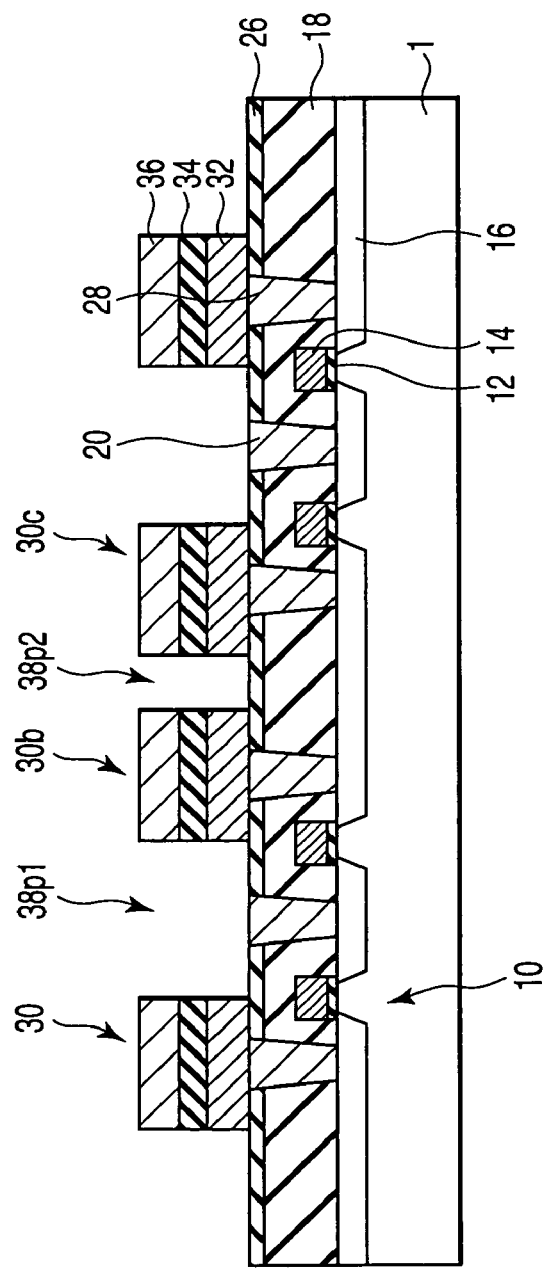
FIGS. 21A and 21B illustrate sectional structures to explain the example of the manufacturing process of the semiconductor device of the second embodiment subsequent to FIGS. 20A and 20B.
Figure 21B:
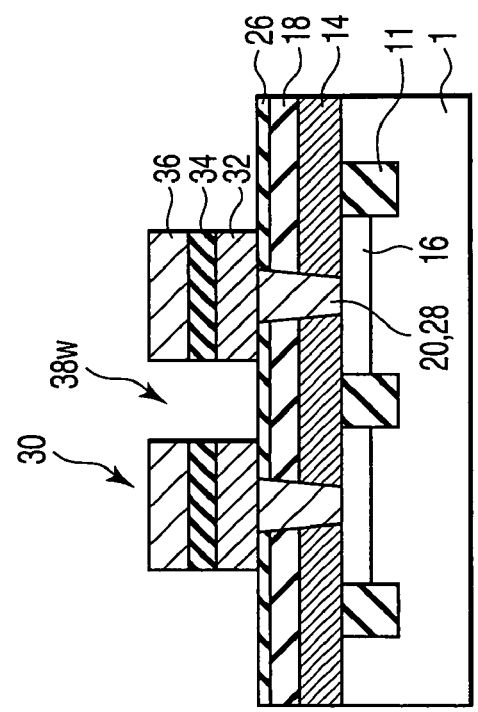
Figure 23A:
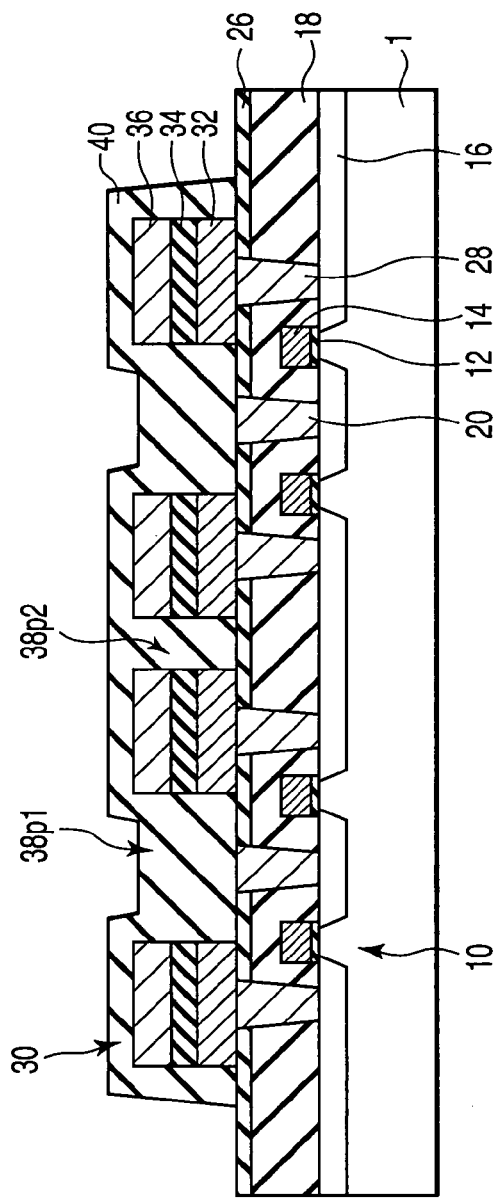
FIGS. 23A and 23B illustrate sectional structures to explain the example of the manufacturing process of the semiconductor device of the second embodiment subsequent to FIGS. 22A and 22B.
Figure 23B:
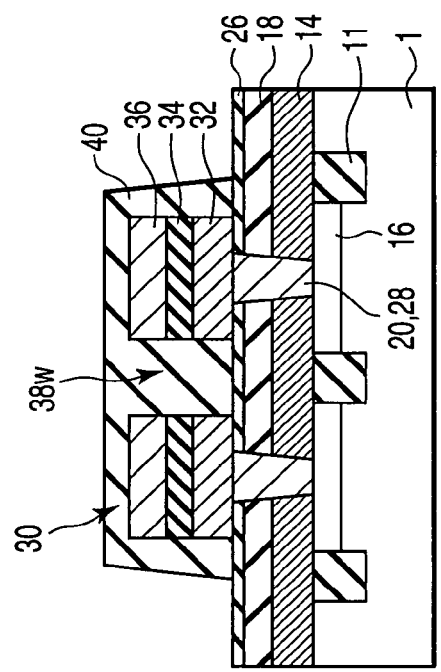

(3) Next, a ferroelectric capacitor 30 is formed. As shown in FIGS. 21A, 21B, materials for a lower electrode 32, a ferroelectric film 34 as a capacitive insulator, and an upper electrode 36 are sequentially deposited on an entire surface of the lower hydrogen barrier film 26. For the lower electrode 32 of the ferroelectric capacitor 30, a conductive film having an oxygen barrier capability is preferred. For example, a material containing Ir, $IrO_2$, Ru, or $RuO_2$ can be used. For the ferroelectric film 34, a metal oxide with a perovskite structure such as PZT or SBT can be used. For the upper electrode 36, for example, Ir, $IrO_2$, Ru, $RuO_2$, or Pt can be used. Then, the upper electrode 36, the ferroelectric film 34, and the lower electrode 32 are processed by lithography and etching to form a ferroelectric capacitor 30. Spaces 38 between the ferroelectric capacitors 30 formed in the above manner have three different widths in the capacitor array. For example, as shown in FIG. 21A, a space 38p1 formed above the source/drain 16b is the widest in width, and a space 38p2 formed above the source/drain 16c is the narrowest in width. Additionally, a space 38w in a WL direction shown in FIG. 21B has a width between the two spaces 38p1, 38p2.

(4) Next, all the spaces 38p1, 38p2, and 38w between the ferroelectric capacitors 30 are planarised by a second interlevel insulator 40 in a self-aligned manner during formation thereof. Deposition conditions of the second interlevel insulator 40 necessary for planarizing the spaces may be similar to those of the first embodiment. The space 38p1 can be planarised in a self-aligned manner by depositing the second interlevel insulator 40 with a thickness equal to or thicker than ½ of a width of the widest space 38p1. Specifically, by setting a thickness of the second interlevel insulator 40 as t(p1) and a width of the space 38p1 as Sp1, the required thickness t(p1) is given by t(p1)> Sp½. By forming the second interlevel insulator with a thickness described above, the entire array of the ferroelectric capacitors 30 can be planarised by the second interlevel insulator 40 in a self-aligned manner during formation thereof as shown in FIGS. 22A, 22B. For the second interlevel insulator 40, e.g., a CVD-SiO$_2$ film using TEOS—O$_3$ that can be isotropically deposited at a low temperature can be used.

(5) Subsequently, the second interlevel insulator 40 is etched back. The etching-back allows thinning of the third interlevel insulator 40 formed on the upper electrode 36, and smoothing of the surface. During the etching-back, as shown in FIGS. 230A, 230B, the second interlevel insulator 40 is preferably removed to expose the lower hydrogen barrier film 26 outside of the array of the ferroelectric capacitors 30. However, a similar effect can be obtained by making the second interlevel insulator 40 sufficiently thin on the lower hydrogen barrier film 26 outside of the capacitor array.

(6) As an upper hydrogen barrier film 42, for example, an Al$_2$O$_3$ film is formed on the second interlevel insulator 40 by sputtering. In the sputtering, coverage is poor if an aspect ratio is large as described above. However, as shown in FIGS. 24A, 24B, since the surface of the second interlevel insulator 40 is planarised in a self-aligned manner, the upper hydrogen barrier film 42 can be formed with excellent coverage even on the space 38p2 having the largest aspect ratio.

Accordingly, the entire array of the ferroelectric capacitors 30 is covered with the hydrogen barrier films 26, 42.

(7) Next, a third contact plug 46 is formed being connected the upper electrode 36 with PL 50 to be formed, and a fourth contact plug 48 is formed being connected even-numbered sources/drains 16b, 16d with PL 50. Specifically, as shown in FIGS. 25A, 25B, a third interlayer insulting film 44 is deposited on an entire surface, and planarised by, e.g., CMP. A third contact hole is formed in the third interlevel insulator 44 and the upper hydrogen barrier film 42 to reach the upper electrode 36, and a fourth contact hole is formed to reach the second contact plug 20 formed in the step (2), both by lithography and etching. Further, a trench for PL is formed in the fourth interlevel insulator 44. A PL wiring material, e.g., phosphorus-doped polysilicon or W, is deposited to fill the third and fourth contact holes and the trench for PL. The deposit, e.g., the polysilicon, on a surface of the third interlevel insulator 44 is removed by, e.g., CMP, thus the third and fourth contact plugs 46, 48 and the PL 50 are formed. The PL 50 is formed to interconnect a pair of ferroelectric capacitors 30 of a direction of PL 50. For example, a PL 50a connects only upper electrodes 36a and 36b of the ferroelectric capacitors 30a and 30b to each other.

Subsequently, a step of multilevel wiring or the like necessary for the semiconductor device is carried out to complete the semiconductor device comprising the ferroelectric memory.

In the ferroelectric memory of the second embodiment formed in the aforementioned manner, it has been verified that switching charge characteristics with respect to a space between the capacitors are not deteriorated even if the space is reduced to 0.4 μm or less as in the case of the ferroelectric memory of the first embodiment shown in FIG. 13. This means that the problems of the conventional art can be solved by the embodiment. That is, even if the space between the capacitors becomes narrow, the hydrogen barrier film can be formed with excellent coverage. As a result, it is possible to prevent penetration of hydrogen into the ferroelectric capacitors in the manufacturing process of the semiconductor device after the formation thereof, and polarization characteristics of the ferroelectric capacitor are not deteriorated.

MODIFICATION OF THE SECOND EMBODIMENT

Various modifications and simplification can be made for the second embodiment. Some examples are described below.

Figure 26A:
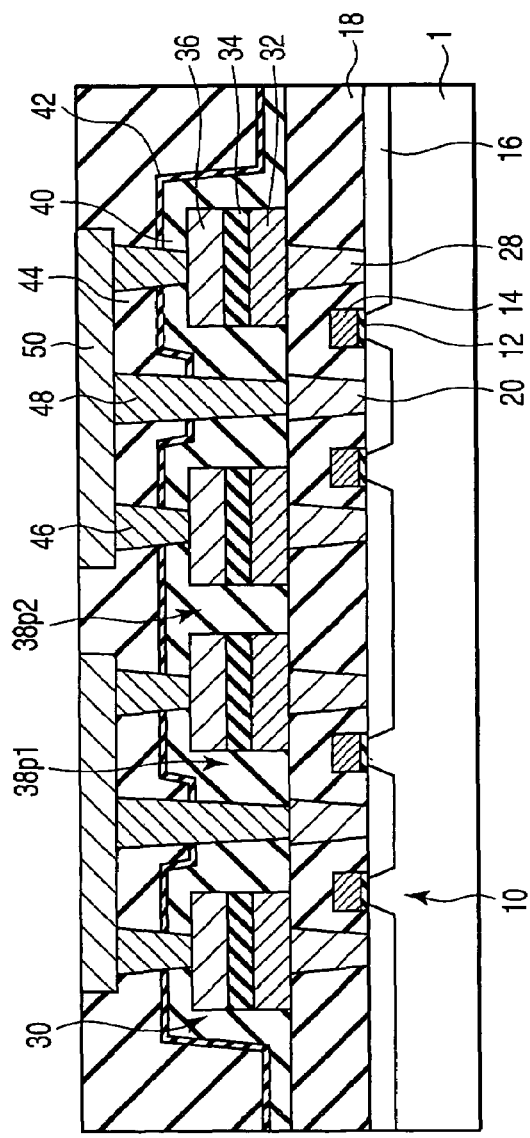
FIGS. 26A and 26B illustrate sectional structures to explain an example of a semiconductor device according to a modification of the second embodiment of the invention.
Figure 26B:
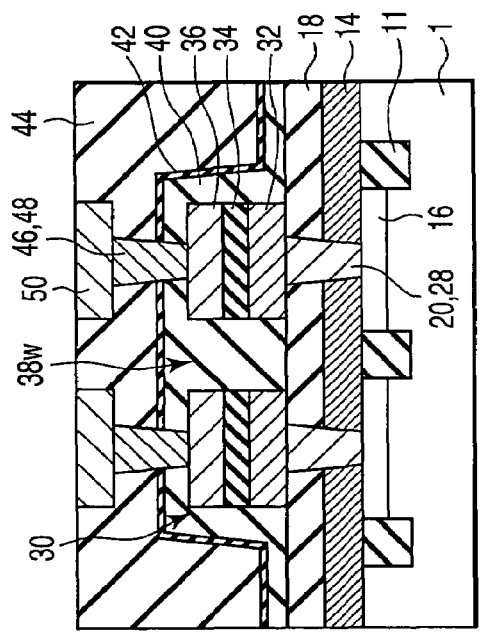

FIGS. 26A, 26B show a modification of the second embodiment in which the lower hydrogen barrier film 26 is omitted for simplification: FIG. 26A shows a sectional structure in a direction parallel to PL 50, and FIG. 26B shows a sectional structure in a direction parallel to WL 14 perpendicular to FIG. 26A. According to this modification, inside an array of ferroelectric capacitors 30, spaces 38 between the capacitors are all planarised in a self-aligned manner during formation of a second interlevel insulator 40 as in the case of the second embodiment. Thus, by forming the upper hydrogen barrier film 42 to be sufficiently wide outside of the capacitor array, it is possible to suppress penetration of hydrogen into the ferroelectric capacitors 30 in the manufacturing process after formation thereof, since coverage of an upper side of the capacitor array with an upper hydrogen barrier film 42 is excellent.

FIGS. 27A, 27B show another modification in which spaces with larger aspect ratios among spaces between adjacent ferroelectric capacitors 30 are selectively planarised. FIG. 27A illustrates a sectional structure in a direction parallel to PL 50, and FIG. 27B illustrates a sectional structure in a direction parallel to WL 14 perpendicular to FIG. 27A. According to this modification, as shown in FIGS. 27A, 27B, different from the second embodiment, spaces 38p2, 38w with larger aspect ratios than a space 38p1 with a widest space between the ferroelectric capacitors 30 are planarised in a self-aligned manner during formation of a second interlevel insulator 40. The planarised spaces 38p2, 38w are portions in which coverage with an upper hydrogen barrier film 42 is likely to become poor according to the conventional art. Because of narrower widths of the spaces 38p2, 38w, a thickness of the second interlevel insulator 40 necessary for planarizing the spaces in a self-aligned manner can be set low. That is, it is only necessary to deposit the second interlevel insulator 40 with a thickness equal to or thicker than ½ of a width of the wider space 38w out of the spaces 38p2 and 38w. A thickness t(w) of the second interlevel insulator 40 necessary for planarizing the space 38w in a self-aligned manner is given by t(w)>Sw/2, where Sw is a width of the space 38w. Here, t(w)<t(p1) is given because of Sw<Sp1, thus the thickness of the second interlevel insulator 40 of the modification can be made thinner than that of the second embodiment. While at the space 38p1 with the widest space in the direction of PL 50, an aspect ratio is not increased much even if the second interlevel insulator 40 with the above thickness is formed. Therefore, an upper hydrogen barrier film 42 can be formed with an acceptable coverage even if it is not fully planarised. Forming the second interlevel insulator 40 thinner provides several advantages not only simply shortening a deposition time thereof but also reducing frequency of CVD equipment maintenance, and the like. The modification is, therefore, advantageous for improving overall throughput in the manufacturing of the semiconductor device or the like. According to the described structure, since the ferroelectric capacitors 30 are formed on a lower hydrogen barrier film 26, the entire array thereof is surrounded with the hydrogen barrier films 26, 42 as in the case of the second embodiment.

FIGS. 28A, 28B show yet another modification in which the lower hydrogen barrier film 26 is omitted from the structure shown in FIGS. 27A, 27B as implemented in the modification shown in FIGS. 26A, 26B: FIG. 28A shows a sectional structure in a direction parallel to PL 50, and FIG. 28B shows a sectional structure in a direction parallel to WL 14 perpendicular to FIG. 28A. According to this modification, spaces 38p2, 38w with larger aspect ratios within an array of ferroelectric capacitors 30 are planarised in a self-aligned manner during formation of a second interlevel insulator 40. According to the modification, as in the case of the modification shown in FIGS. 26A, 26B, by forming an upper hydrogen barrier film 42 to be sufficiently wide outside of the capacitor array, it is possible to suppress penetration of hydrogen into the ferroelectric capacitors 30 in a manufacturing process after formation thereof.

Figure 29A:
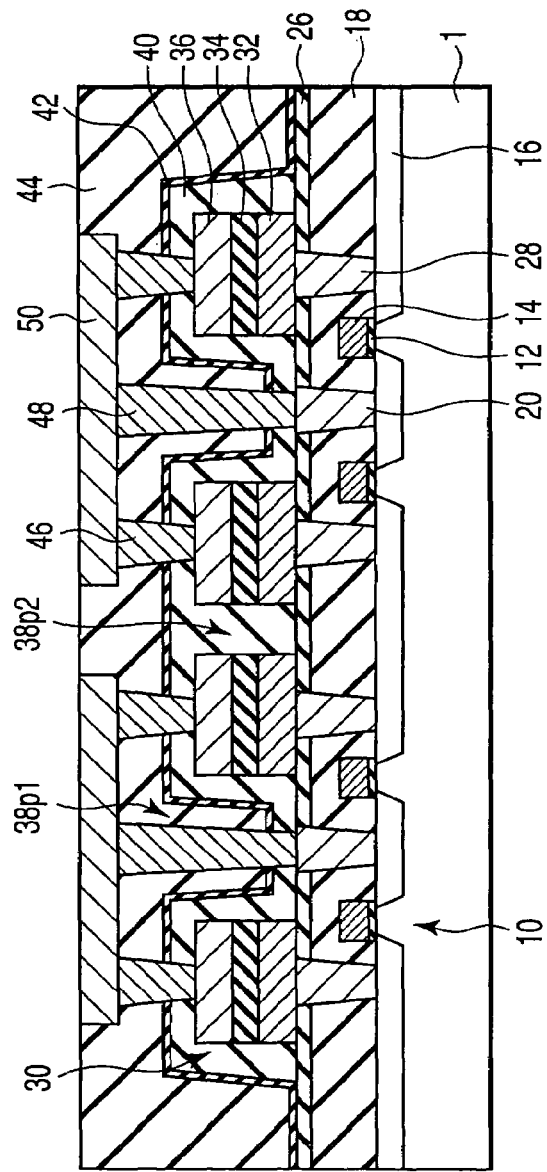
FIGS. 29A and 29B illustrate sectional structures to explain an example of a semiconductor device according to yet another modification of the second embodiment of the invention.
Figure 29B:
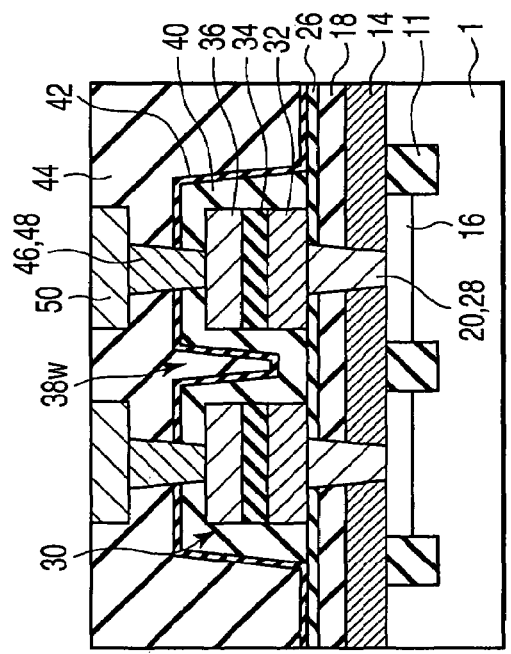
Figure 31:
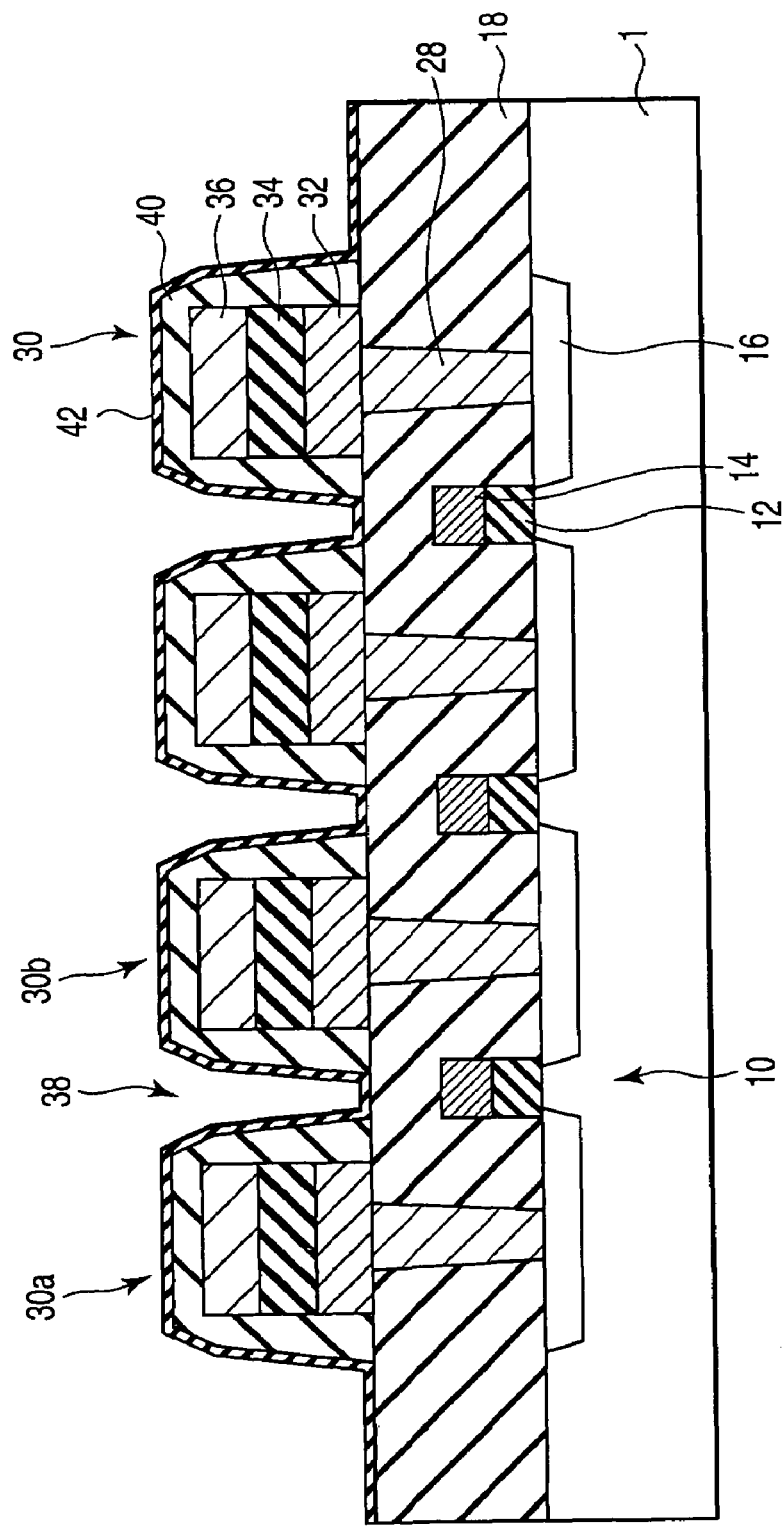
FIG. 31 illustrates a sectional structure of a semiconductor device according to a conventional art.
Figure 32:
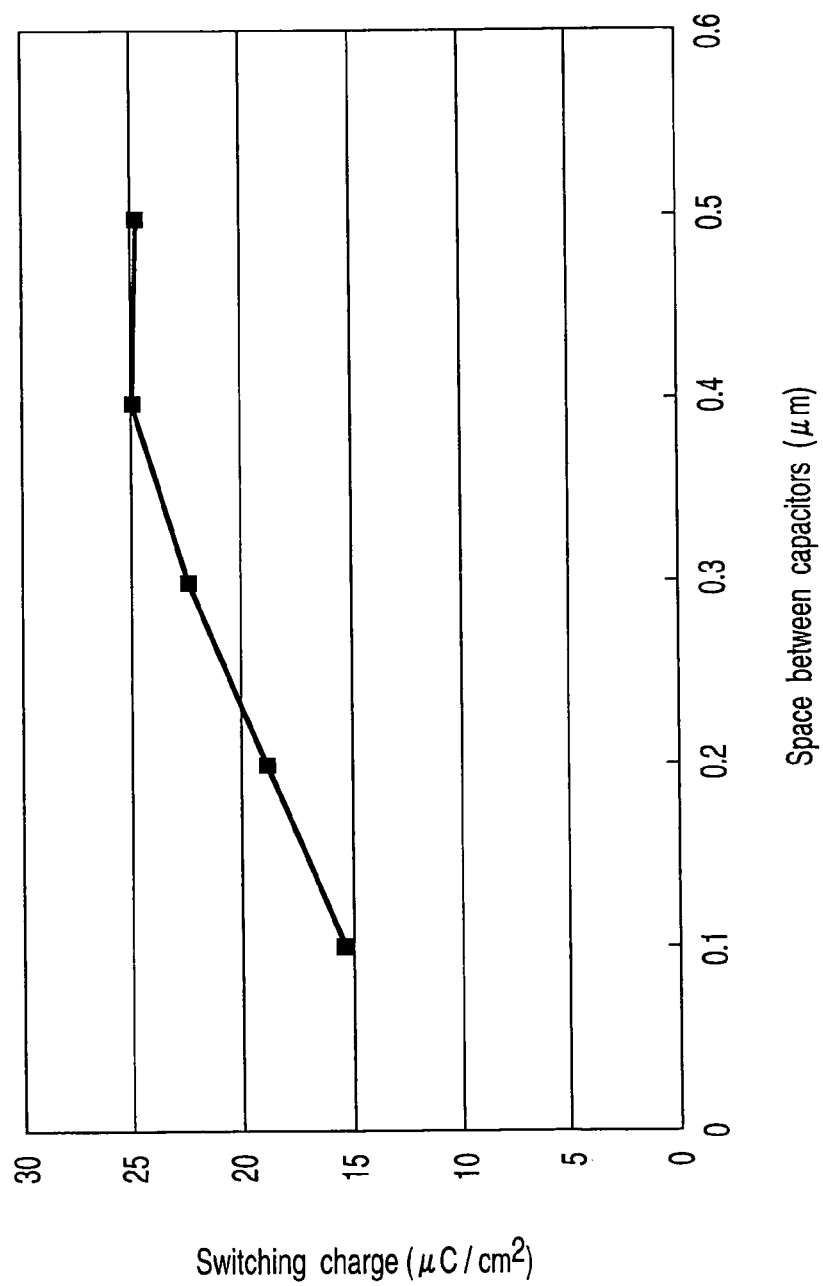
FIG. 32 illustrates switching charge characteristics of the semiconductor device of the conventional art.

FIGS. 29A, 29B show a further simplified example of the modification of FIGS. 27A, 27B. Different from the modification of FIGS. 27A, 27B, inside an array of ferroelectric capacitors 30, only a space 38p2 with the narrowest space between the ferroelectric capacitors 30 is planarised. FIG. 29A illustrates a sectional structure in a direction parallel to PL 50, and FIG. 29B illustrates a sectional structure in a direction parallel to WL 14 perpendicular to FIG. 29A. The space 38p2 is a portion in which an aspect ratio is largest, and coverage with an upper hydrogen barrier film 42 is likely to become poorest according to the conventional art. Because of its narrow space 38p2, even if the second interlevel insulator 40 is formed thin, the space 38p2 can be planarised in a self-aligned manner during formation thereof. Thus, a thickness of the second interlevel insulator 40 necessary for planarizing the space 38p2 in a self-aligned manner can be made thinner. That is, it is only necessary to deposit the second interlevel insulator 40 with a thickness equal to or thicker than ½ of a width of the space 38p2. A thickness $t(p2)$ of the second interlevel insulator 40 necessary for planarizing the space 38p2 in a self-aligned manner is given by $t(p2) > Sp2/2$, where $Sp2$ is a width of the space 38p2. Here, $t(p2) < t(p1)$ is given because of $Sp2 < Sw < Sp1$, thus the second interlevel insulator 40 of the modification can be made thinner than those of the second embodiment and the modifications shown in FIGS. 27A, 27B and FIGS. 28A, 28B. While at the spaces 38p1, 38w having wider spaces, an upper hydrogen barrier film 42 can be formed with an acceptable coverage even if the spaces are not fully planarised. Forming the second interlevel insulator 40 thinner provides several advantages not only simply shortening a deposition time thereof but also reducing frequency of CVD equipment maintenance, and the like. The modification is, therefore, advantageous for improving overall throughput in the manufacturing of the semiconductor device or the like. According to the described structure, as in the case of the second embodiment, since the ferroelectric capacitors 30 are formed on a lower hydrogen barrier film 26, the entire array thereof is surrounded with the hydrogen barrier films 26, 42.

FIGS. 30A, 30B show a further simplified modification in which the lower hydrogen barrier film 26 is omitted from the structure shown in FIGS. 29A, 29B: FIG. 30A shows a sectional structure in a direction parallel to PL 50, and FIG. 30B shows a sectional structure in a direction parallel to WL 14 perpendicular to FIG. 30A. According to this modification, as in the case of the modification in FIGS. 29A, 29B, only a space 38p2 with the largest aspect ratio in an array of ferroelectric capacitors 30 is planarised in a self-aligned manner during formation of a second interlevel insulator 40. According to the modification, as in the case of the modification shown in FIGS. 26A, 26B, by forming an upper hydrogen barrier film 42 to be sufficiently wide outside of the capacitor array, it is possible to suppress penetration of hydrogen into the ferroelectric capacitors 30.

The present invention provides a semiconductor storage device wherein spaces between a plurality of ferroelectric capacitors can be planarised in a self-aligned manner during formation of an interlevel insulator, thus the ferroelectric capacitors are sufficiently covered with a hydrogen barrier film formed thereon, and its manufacturing method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor storage device comprising:
at least one field effect transistor formed on one surface side of a semiconductor substrate;
a first hydrogen barrier film formed above the field effect transistor;
a capacitor array comprising a plurality of ferroelectric capacitors formed close to each other above the first hydrogen barrier film;
a single insulating film configured to cover the entire top portion of the capacitor array, to planarize a space between adjacent ferroelectric capacitors by continuously disposing the single insulating film inside the capacitor array, and to contact with the first hydrogen barrier film between the adjacent ferroelectric capacitors;
a second hydrogen barrier film formed on the insulating film and being brought into contact with the first hydrogen barrier film outside of the capacitor array; and
a transistor-capacitor parallel unit in which said at least one field effect transistor and one ferroelectric capacitor are connected in parallel.

2. The semiconductor storage device according to claim 1, wherein each of the ferroelectric capacitors comprises a lower electrode, a capacitive insulating film, and an upper electrode, wherein the lower electrode is connected to one source/drain of the field effect transistor, and the upper electrode is connected to the other source/drain of the field effect transistor and an upper electrode of another ferroelectric capacitor adjacent to the ferroelectric capacitor.

3. The semiconductor storage device according to claim 1, wherein the insulating film selectively planarizes space(s) having larger aspect ratio among spaces between the adjacent ferroelectric capacitors in a self-aligned manner.

4. A semiconductor storage device comprising:
   at least one field effect transistor formed on one surface side of a semiconductor substrate;
   a first insulating film formed to cover the field effect transistor;
   a capacitor array comprising a plurality of ferroelectric capacitors formed close to each other above the first insulating film;
   a single second insulating film configured to cover the entire top portion of the capacitor array, to planarize a space between adjacent ferroelectric capacitors by continuously disposing the single insulating film inside the capacitor array, and to contact with the first insulating film between the adjacent ferroelectric capacitors;
   a hydrogen barrier film formed on the second insulating film; and
   said field effect transistor and a ferroelectric capacitor of said array of ferroelectric capacitors are connected in parallel to form a transistor-capacitor parallel unit,
   a transistor-capacitor parallel unit in which said at least one field effect transistor and one ferroelectric capacitor are connected in parallel.

5. The semiconductor storage device according to claim 4, wherein each of the ferroelectric capacitors comprises a lower electrode, a capacitive insulating film, and an upper electrode, wherein the lower electrode is connected to one source/drain of the field effect transistor, and the upper electrode is connected to the other source/drain of the field effect transistor and an upper electrode of another ferroelectric capacitor adjacent to the ferroelectric capacitor.

6. The semiconductor storage device according to claim 4, wherein the insulating film selectively planarizes space(s) having larger aspect ratio (ratio of depth/space) among spaces between the adjacent ferroelectric capacitors in a self-aligned manner.

* * * * *